US012721066B2

(12) United States Patent
Chui et al.

(10) Patent No.: US 12,721,066 B2
(45) Date of Patent: Aug. 25, 2026

(54) ALUMINUM NITRIDE DIPOLE DOPANT FILM FOR TUNING MULTI-VT DEVICES

(71) Applicant: Taiwan Semiconductor Manufacturing Co., Ltd., Hsinchu (TW)

(72) Inventors: Chi On Chui, Hsinchu (TW); Cheng-Hao Hou, Hsinchu (TW); Da-Yuan Lee, Jhubei City (TW); Pei Ying Lai, Hsinchu (TW); Yi Hsuan Chen, Hsinchu (TW); Jia-Yun Xu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 367 days.

(21) Appl. No.: 18/346,314

(22) Filed: Jul. 3, 2023

(65) Prior Publication Data

US 2024/0332004 A1 Oct. 3, 2024

Related U.S. Application Data

(60) Provisional application No. 63/493,008, filed on Mar. 30, 2023.

(51) Int. Cl.

| | |
|---|---|
| ***H10P 14/692*** | (2026.01) |
| ***H10D 30/01*** | (2025.01) |
| ***H10D 30/67*** | (2025.01) |
| ***H10D 62/10*** | (2025.01) |
| ***H10D 64/01*** | (2025.01) |
| ***H10P 14/60*** | (2026.01) |
| *H10D 30/43* | (2025.01) |

(52) U.S. Cl.

CPC ..... *H10P 14/69391* (2026.01); *H10D 30/014* (2025.01); *H10D 30/6735* (2025.01); *H10D 62/121* (2025.01); *H10D 64/017* (2025.01); *H10P 14/6339* (2026.01); *H10D 30/43* (2025.01); *H10D 30/6757* (2025.01)

(58) Field of Classification Search

None

See application file for complete search history.

(56) References Cited

U.S. PATENT DOCUMENTS

| | | | |
|---|---|---|---|
| 7,488,640 | B2 | 2/2009 | Bojarczuk, Jr. et al. |
| 11,342,188 | B2 | 5/2022 | Yu et al. |
| 11,888,045 | B2 | 1/2024 | Lin et al. |
| 2012/0319179 | A1 | 12/2012 | Huang et al. |
| 2016/0133738 | A1 | 5/2016 | Chang et al. |

(Continued)

FOREIGN PATENT DOCUMENTS

| | | | |
|---|---|---|---|
| DE | 102019125922 | B3 | 2/2021 |
| DE | 102020130401 | A1 | 12/2021 |

(Continued)

*Primary Examiner* — Daniel Whalen

(74) *Attorney, Agent, or Firm* — Slater Matsil, LLP

(57) ABSTRACT

A method includes forming a gate dielectric on a semiconductor region, depositing an aluminum nitride layer on the gate dielectric, depositing an aluminum oxide layer on the aluminum nitride layer, performing an annealing process to drive aluminum in the aluminum nitride layer into the gate dielectric, removing the aluminum oxide layer and the aluminum nitride layer, and forming a gate electrode on the gate dielectric.

20 Claims, 42 Drawing Sheets

(56) References Cited

U.S. PATENT DOCUMENTS

| | | | |
|---|---|---|---|
| 2019/0318967 | A1* | 10/2019 | Chen .................... H10D 62/235 |
| 2020/0119164 | A1* | 4/2020 | Tsau .................. H01L 21/28185 |
| 2021/0366783 | A1 | 11/2021 | Chu et al. |
| 2021/0375629 | A1* | 12/2021 | Lai ..................... H10D 84/0144 |
| 2022/0238680 | A1 | 7/2022 | Hung et al. |
| 2022/0254912 | A1 | 8/2022 | Ramdani |
| 2022/0328650 | A1 | 10/2022 | Tai et al. |
| 2023/0360918 | A1 | 11/2023 | Lai et al. |

FOREIGN PATENT DOCUMENTS

| | | | |
|---|---|---|---|
| KR | 20220000910 | A | 1/2022 |
| TW | 594992 | B | 6/2024 |

* cited by examiner

ALUMINUM NITRIDE DIPOLE DOPANT FILM FOR TUNING MULTI-VT DEVICES

PRIORITY CLAIM AND CROSS-REFERENCE

This application claims the benefit of U.S. Provisional Application No. 63/493,008, filed on Mar. 30, 2023, and entitled "AlN Dipole with Ex-Situ/In-Situ Al2O3 Hardmask for Multi-Vt Device Offering," which application is hereby incorporated herein by reference.

BACKGROUND

Semiconductor devices are used in a variety of electronic applications such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. As the minimum feature sizes are reduced, however, additional problems arise and should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
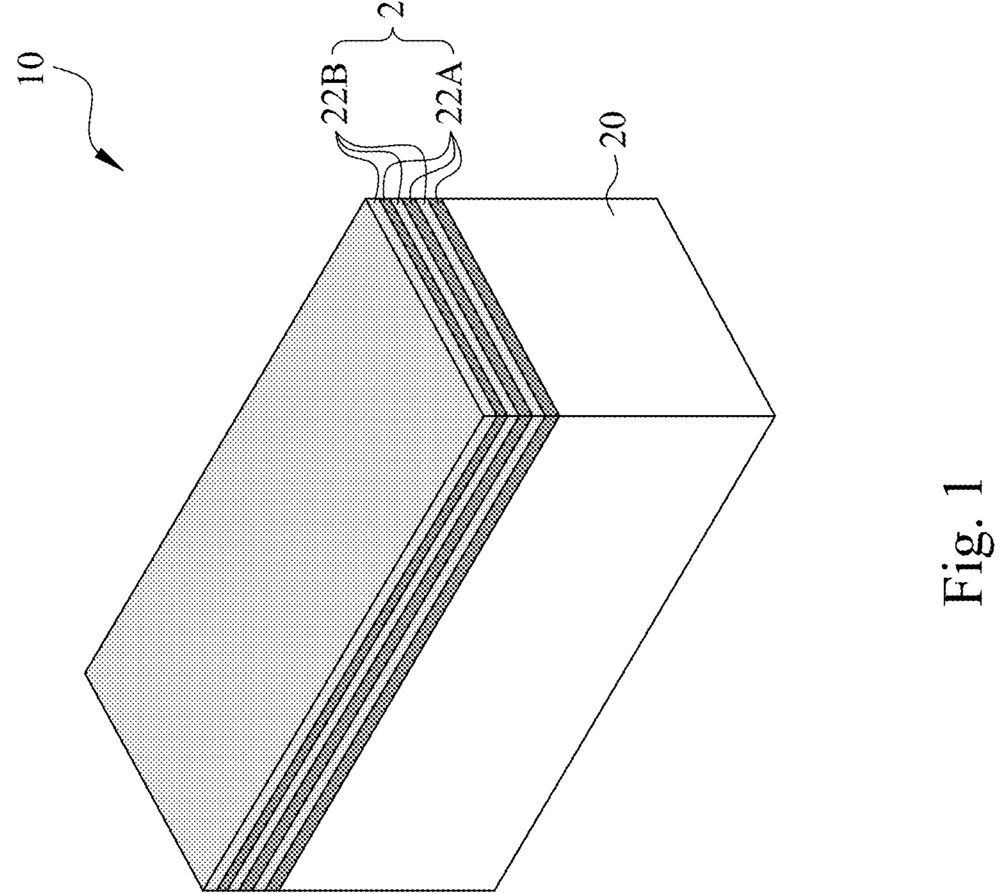
FIGS. 1-4, 5A, 5B, 6A, 6B, 7A, 7B, 8A, 8B, 9A, 9B, 10A, 10B, 10C, 11A, 11B, 12A, 12B, 13A, 13B, 14-26, 27A, 27B, 28A, 28B, 29A, 29B, 30A, and 30B illustrate the intermediate stages in the formation of Gate-All-Around (GAA) transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of tuning the threshold voltages of transistors is provided. In accordance with some embodiments of the present disclosure, an aluminum nitride (AlN) dipole dopant film is used to dope the high-k dielectric layers in the gate dielectrics of transistors. An aluminum oxide (AlO, which may be $Al_2O_3$) may be used as a hard mask. The AlN dipole dopant film has a binding energy (about 2.02 eV) lower than the binding energy (about 4.61 eV) of AlO dipole dopant films, and hence is more efficient in introducing aluminum dipole into the high-k dielectric layers than the AlO dipole dopant films. It is appreciated that although Gate-All-Around (GAA) transistors are used as an example, the concept of the present disclosure may be applied to other types of transistors such as planar transistors, Fin Field-Effect Transistors (FinFETs), Complementary Field-Effect Transistors (CFETs), and the like.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-4, 5A, 5B, 6A, 6B, 7A, 7B, 8A, 8B, 9A, 9B, 10A, 10B, 10C, 11A, 11B, 12A, 12B, 13A, 13B, 14-26, 27A, 27B, 28A, 28B, 29A, 29B, 30A, and 30B illustrate the intermediate stages in the formation of GAA transistors in accordance with some embodiments.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

Figure 44:
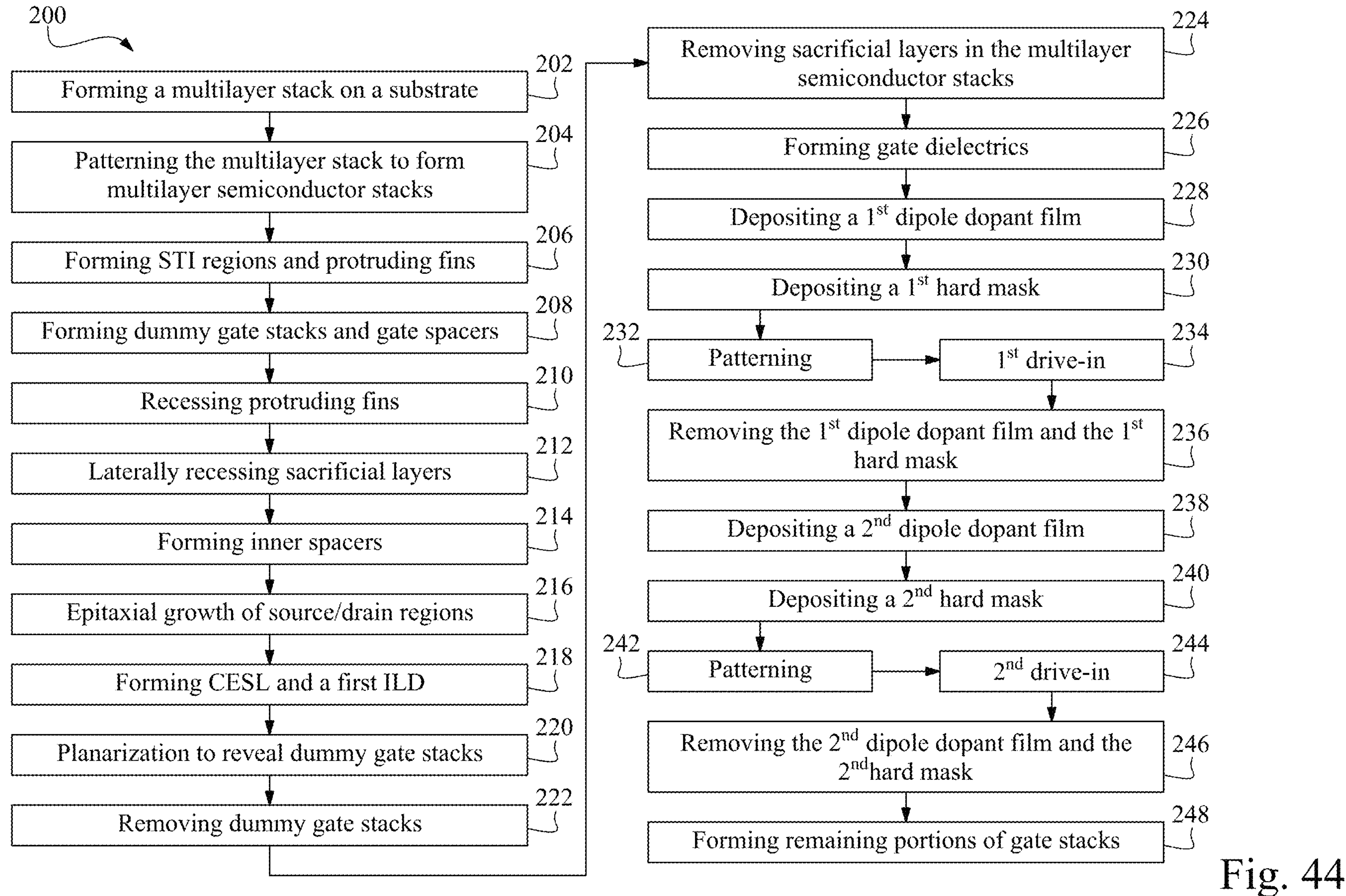
FIG. 44 illustrates a process flow for forming multi-Vt devices in accordance with some embodiments.

In accordance with some embodiments, multilayer stack 22 is formed through a series of deposition processes for depositing alternating materials. The respective process is illustrated as process 202 in the process flow 200 shown in FIG. 44. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
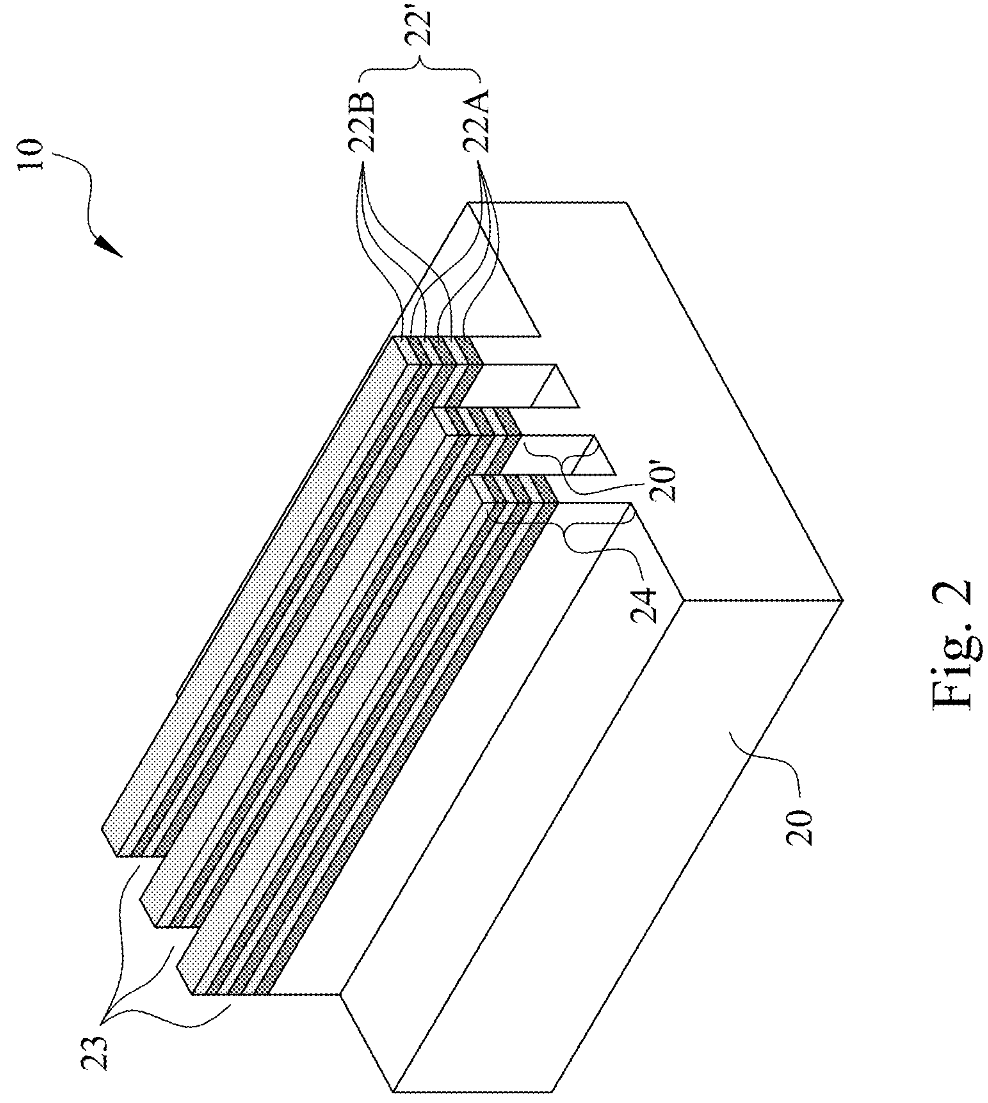

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 44. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
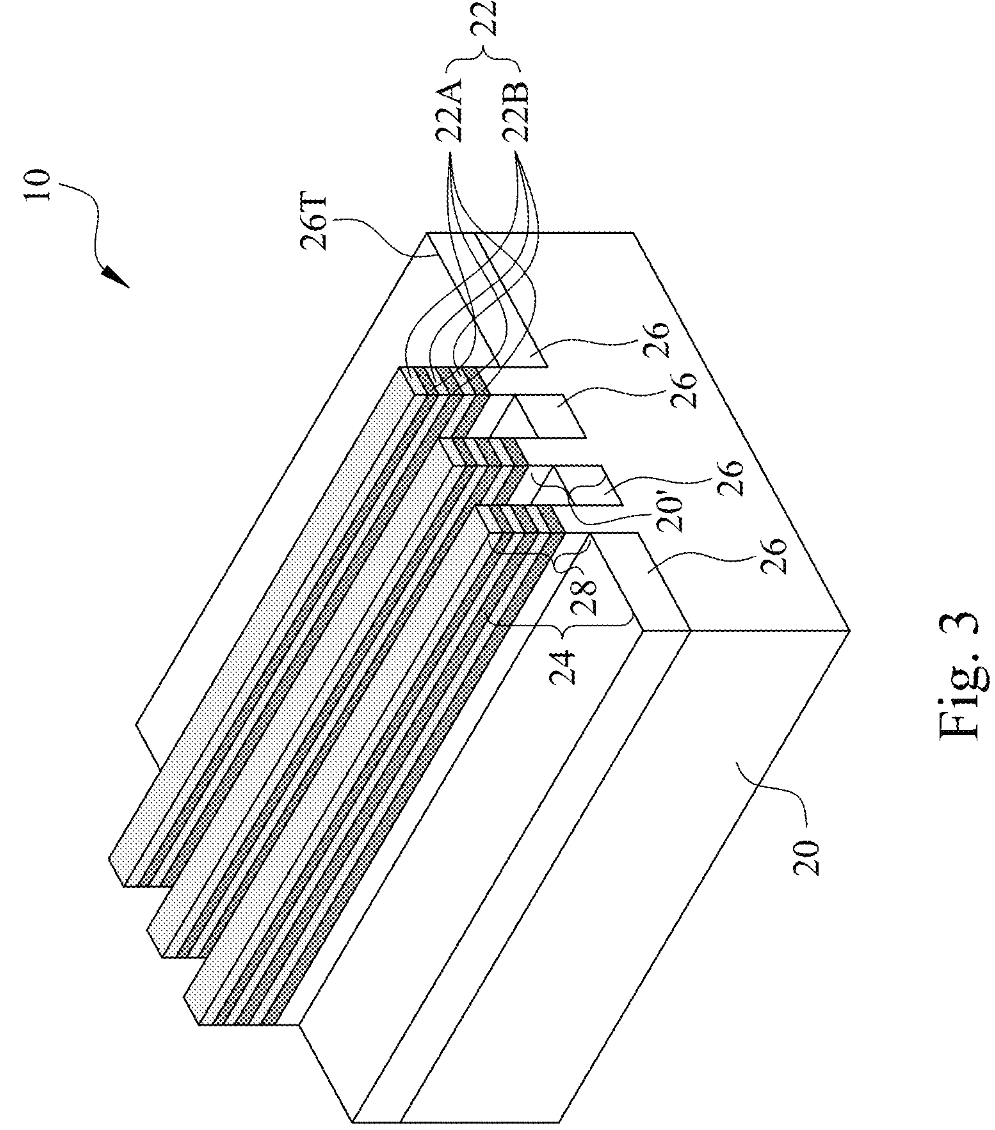

FIG. 3 illustrates the formation of isolation regions 26, which are also referred to as Shallow Trench Isolation (STI) regions throughout the description. The respective process is illustrated as process 206 in the process flow 200 shown in FIG. 44. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
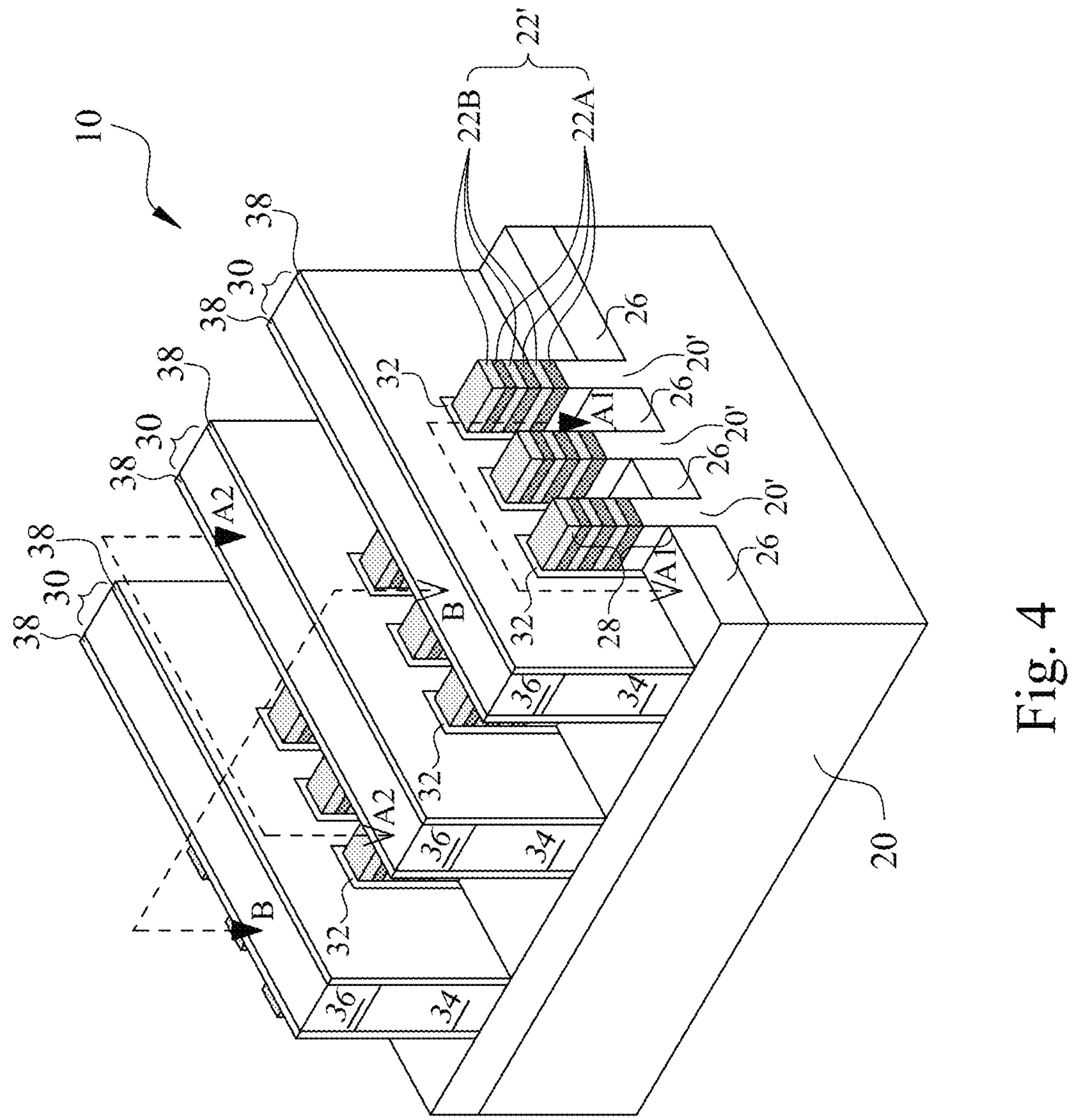

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 44. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used.

Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a pattering process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 5B:
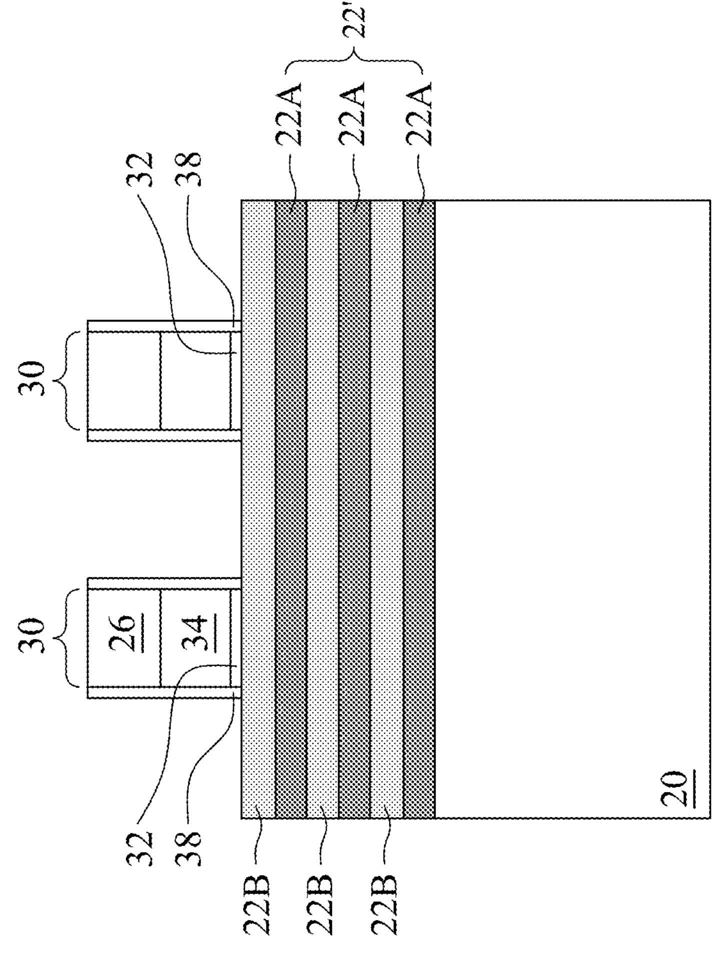
Figure 5A:
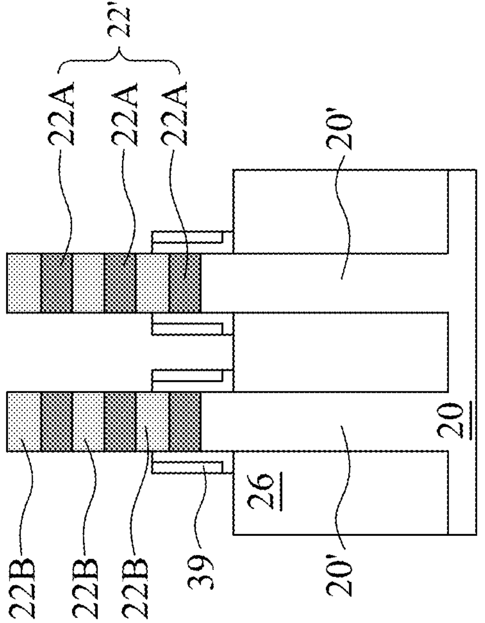

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by dummy gate stacks 30 and gate spacers 38, and is perpendicular to the gate-length direction. Fin spacers 39, which are on the sidewalls of protruding fins 28, are also illustrated. FIG. 5B illustrates the reference cross-section B-B in FIG. 4, which reference cross-section is parallel to the lengthwise directions of protruding fins 28. Fin spacers 39 are also illustrated.

Figure 6B:
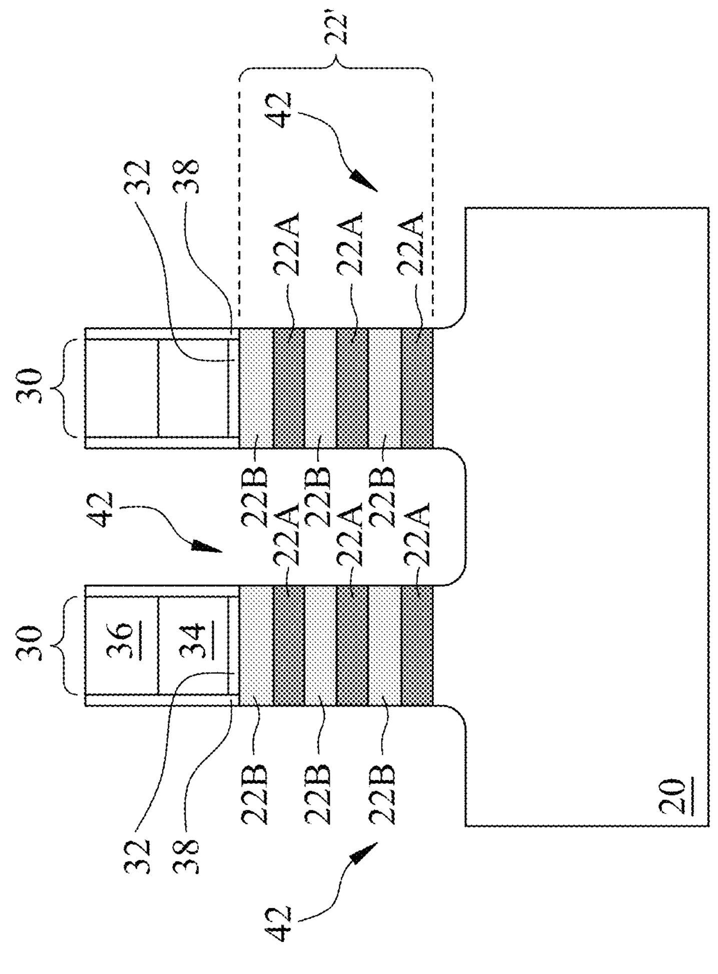
Figure 6A:
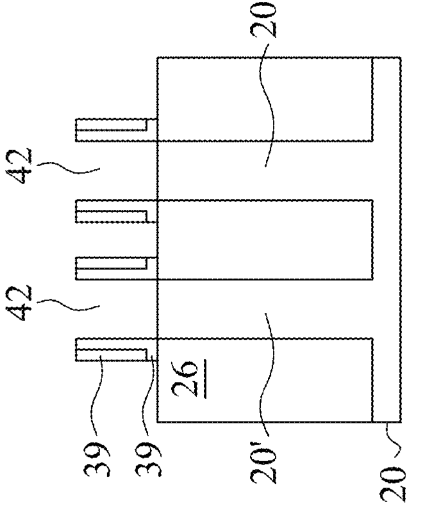

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 44. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Figure 7B:
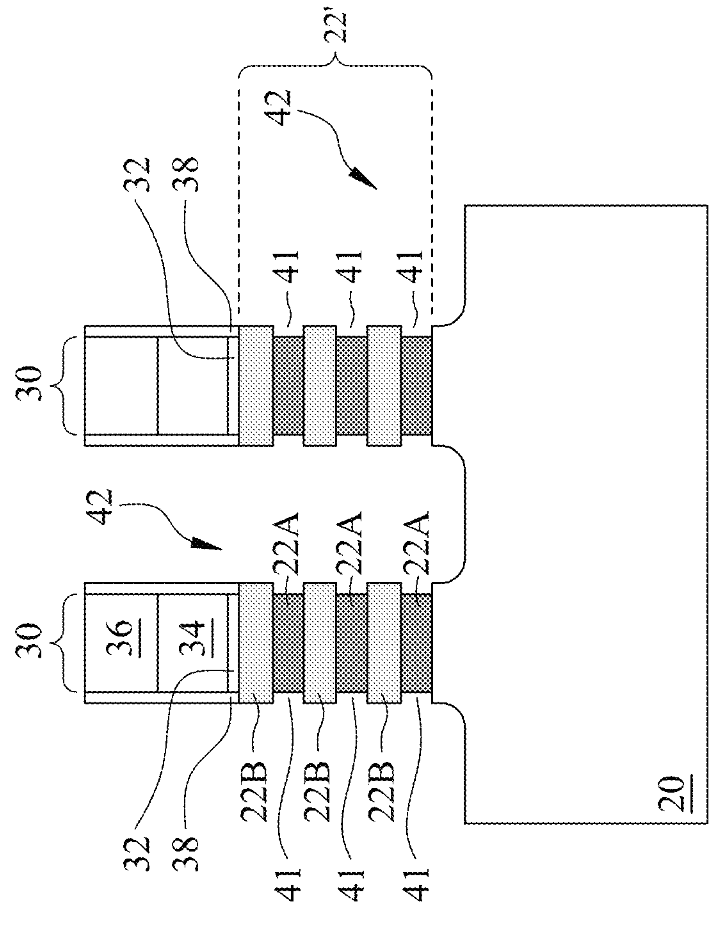
Figure 7A:
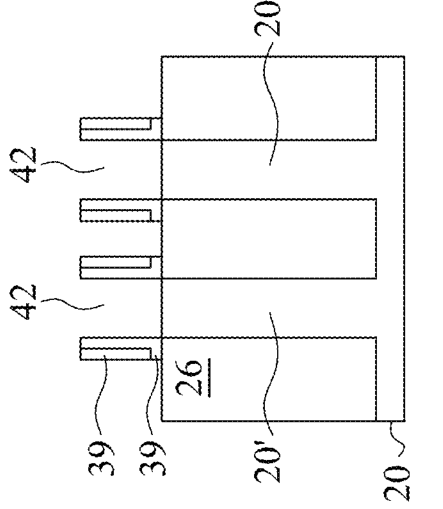

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 shown in FIG. 44. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, or the like, and may be performed using any suitable process temperatures (for example, between about 400° C. and about 600° C.) and a suitable process time (for example, between about 100 seconds and about 1,000 seconds). In accordance with alternative embodiments, the lateral recessing of sacrificial semiconductor layers 22A is performed through an isotropic dry etching process or a combination of a dry etching process and a wet etching process.

Figure 8B:
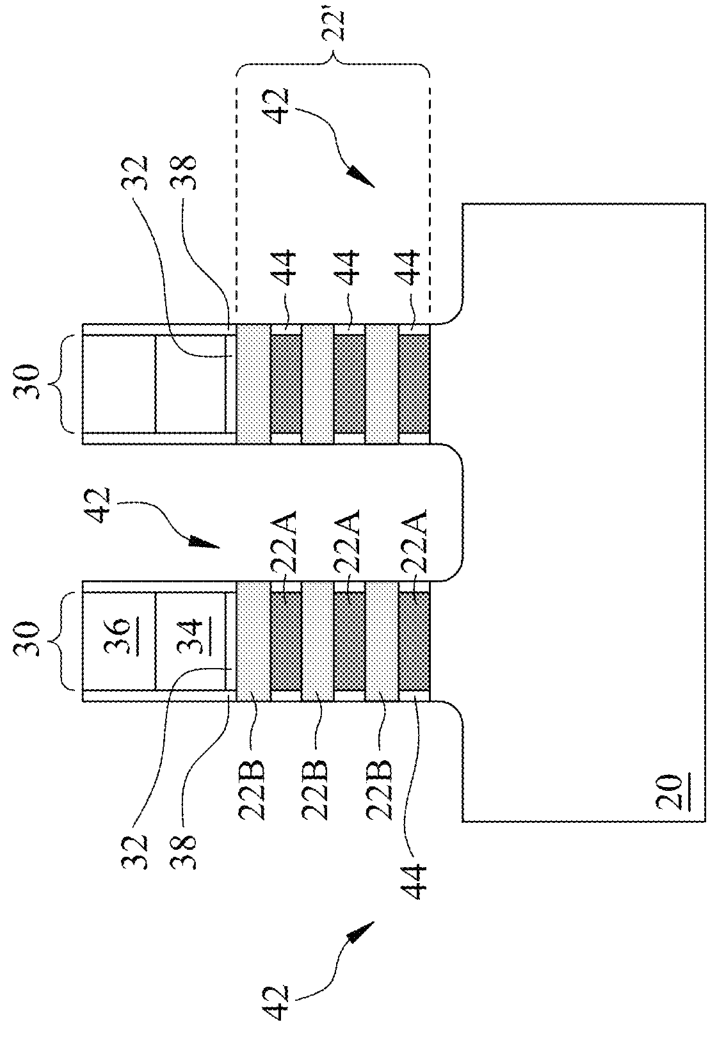
Figure 8A:
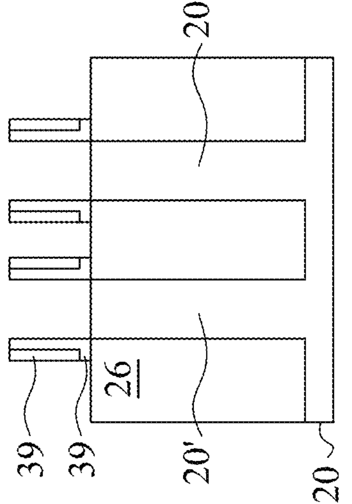

FIGS. 8A and 8B illustrate the formation of inner spacers 44. The respective process is illustrated as process 214 in the process flow 200 shown in FIG. 44. The formation process incudes depositing a spacer layer extending into recesses 41, and performing an etching process to remove the portions of inner spacer layer outside of recesses 41, thus leaving inner spacers 44 in recesses 41. Inner spacers 44 may be formed of or comprise SiOCN, SiON, SiOC, SiCN, or the like. Inner spacers 44 may also be porous so that they have a lower-k value lower than, for example, about 3.5. In accordance with some embodiments, the etching of the spacer layer may be performed through a wet etching process, in which the etching chemical may include $H_2SO_4$, diluted HF, ammonia solution ($NH_4OH$, ammonia in water), or the like, or combinations thereof.

Figure 9B:
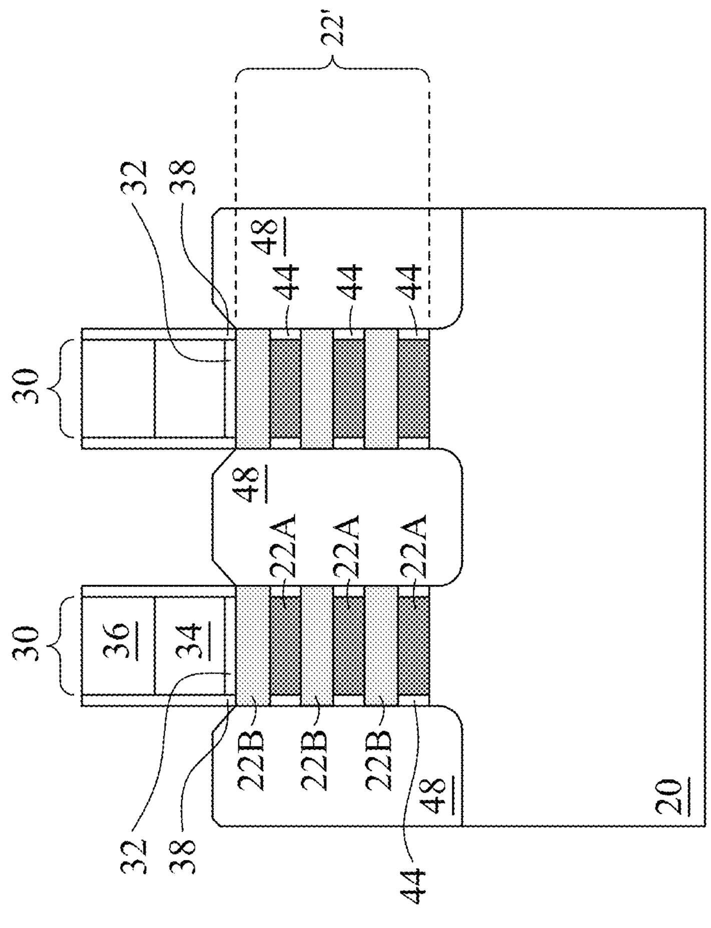
Figure 9A:
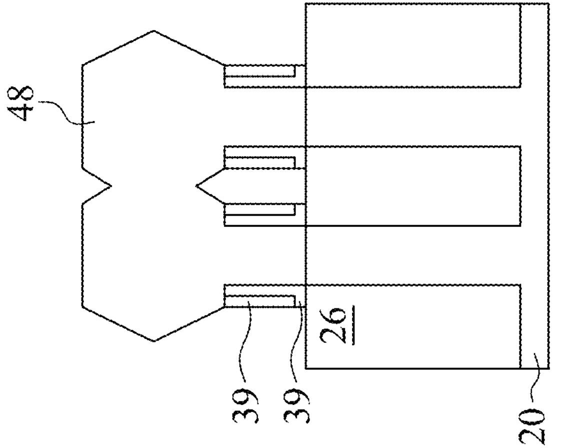

Referring to FIGS. 9A and 9B, epitaxial source/drain regions 48 are formed in recesses 42. The respective process is illustrated as process 216 in the process flow 200 shown in FIG. 44. In accordance with some embodiments, the source/drain regions 48 may exert stress on the nanostructures 22B, which are used as the channels of the corresponding GAA transistors, thereby improving performance. In accordance with some embodiments, the corresponding transistor is n-type, and epitaxial source/drain regions 48 are accordingly formed as of n-type by doping an n-type dopant. For example, silicon phosphorous (SiP), silicon carbon phosphorous (SiCP), or the like may be grown to form epitaxial source/drain regions 48. After recesses 42 are filled with epitaxy regions 48, the further epitaxial growth of epitaxial source/drain regions 48 causes epitaxy regions 48 to expand horizontally, and facets may be formed. The further growth of epitaxial source/drain regions 48 may also cause neighboring epitaxy regions 48 to merge with each other.

Figures 10A, 10B:
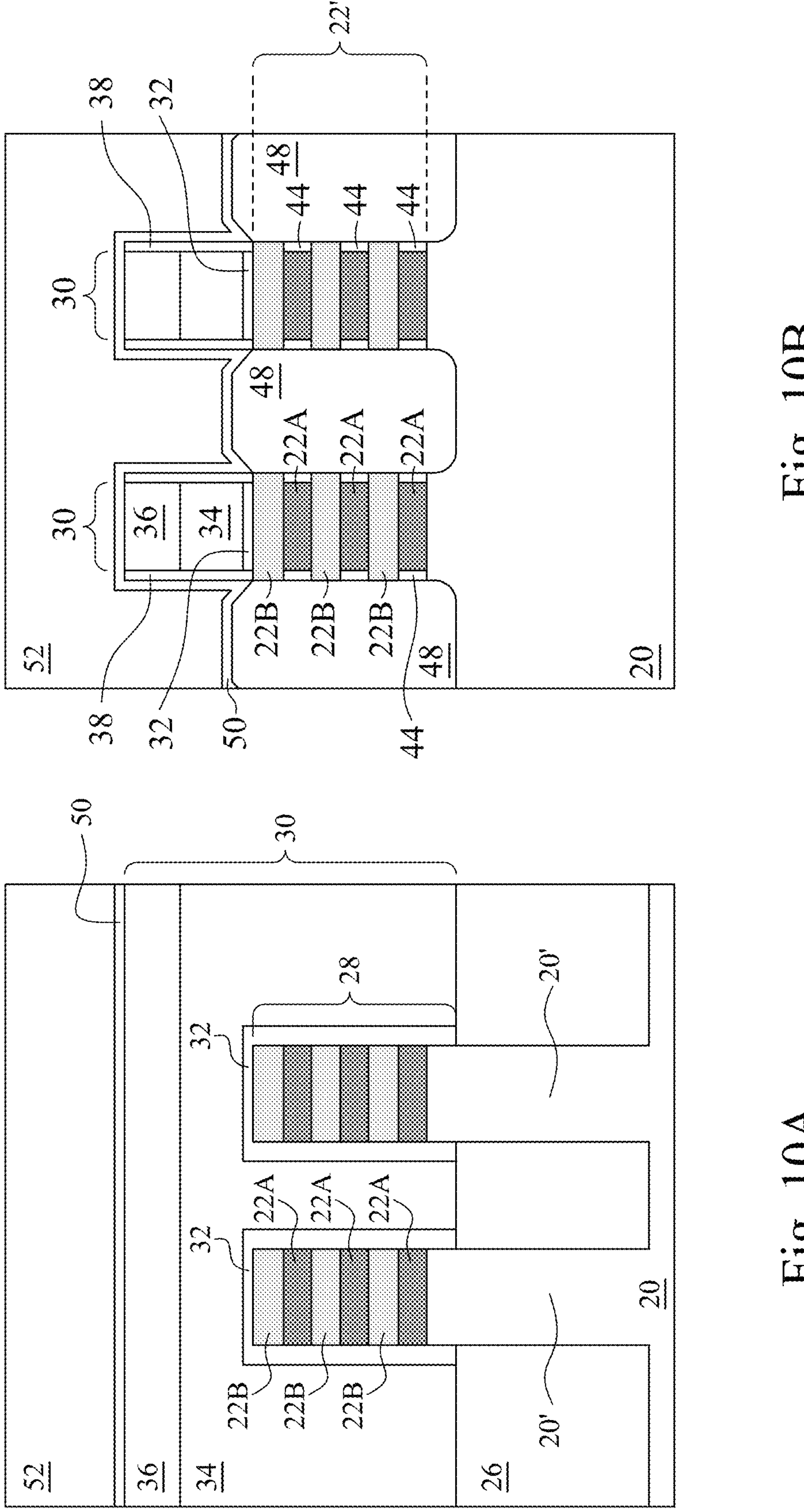
Figure 10C:
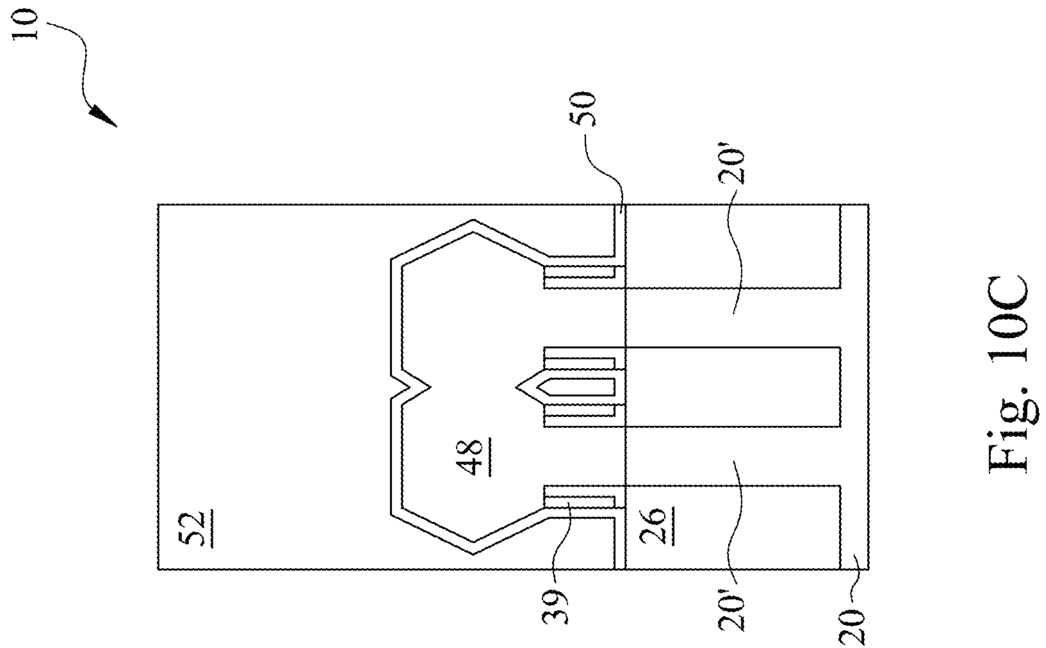

FIGS. 10A, 10B, and 10C illustrate the cross-sectional views of the structure after the formation of Contact Etch Stop Layer (CESL) 50 and Inter-Layer Dielectric (ILD) 52. FIGS. 10A, 10B, and 10C are obtained from the same cross-section same as the cross-sections A2-A2, B-B, and A1-A1, respectively, in FIG. 4. The respective process is illustrated as process 218 in the process flow 200 shown in FIG. 44. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

Figure 11B:
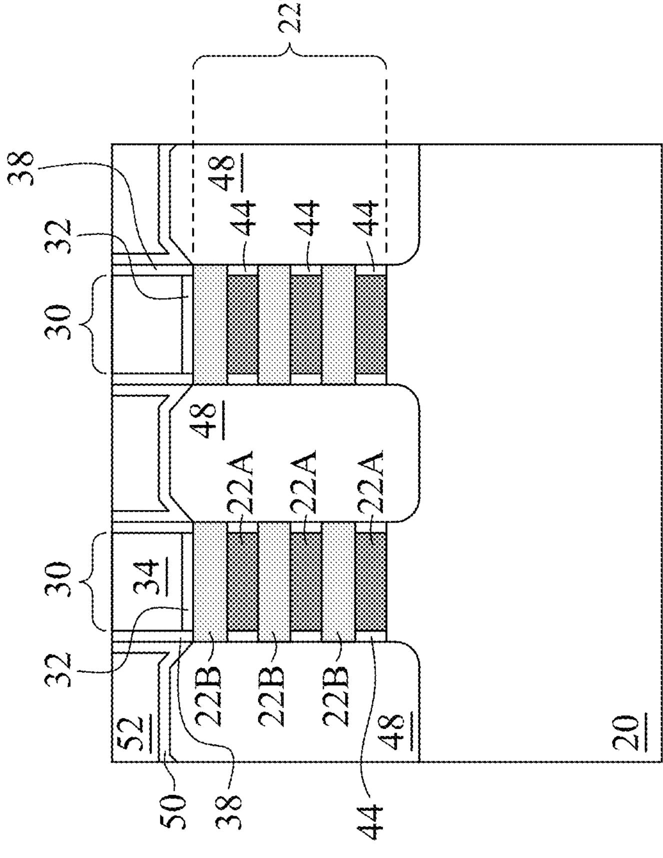
Figure 11A:
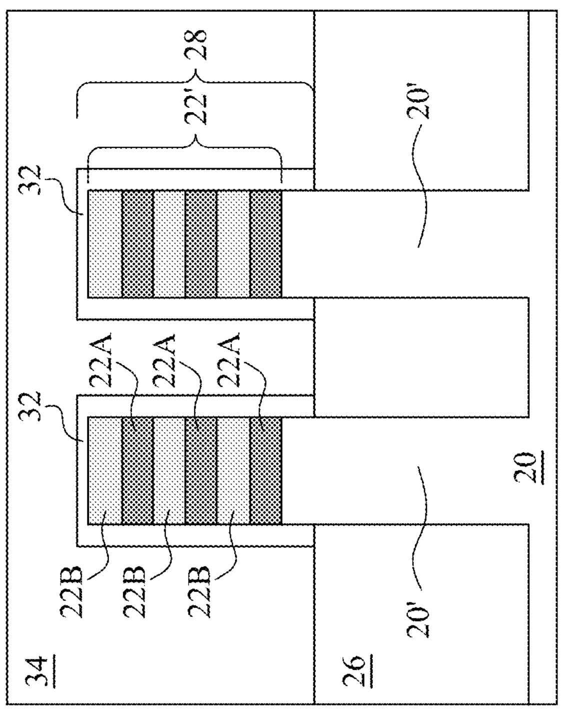

In subsequent processes, replacement gate stacks are formed to replace dummy gate stacks 30. Referring to FIGS. 11A and 11B, a planarization process such as a CMP process or a mechanical grinding process is performed to level the top surface of ILD 52. The respective process is illustrated as process 220 in the process flow 200 shown in FIG. 44. In accordance with some embodiments, the planarization process may remove hard masks 36 to reveal dummy gate electrodes 34, as shown in FIG. 11B. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level with each other within process variations.

Figure 12B:
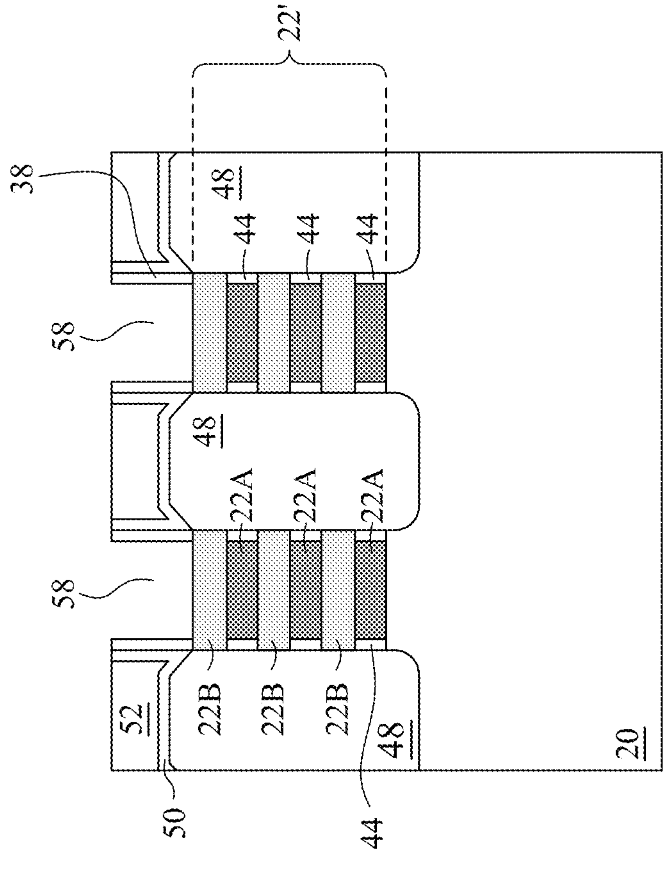
Figure 12A:
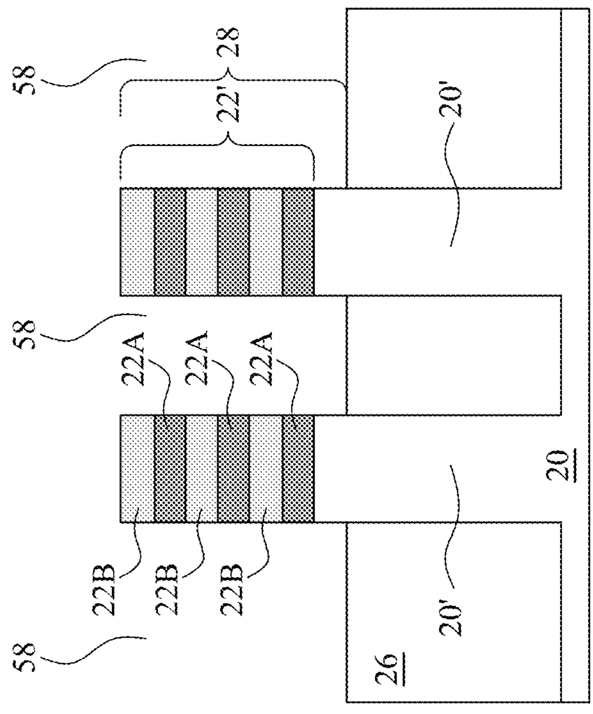

Next, dummy gate electrodes 34 (and hard masks 36, if remaining) are removed in one or more etching processes, so that recesses 58 are formed, as shown in FIGS. 12A and 12B. The respective process is illustrated as process 222 in the process flow 200 shown in FIG. 44. The portions of the dummy gate dielectrics 32 in recesses 58 are also removed. In accordance with some embodiments, dummy gate electrodes 34 and dummy gate dielectrics 32 are removed through dry etching processes. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The corresponding portions of the multilayer stacks 22' are between neighboring pairs of the epitaxial source/drain regions 48.

Figure 13B:
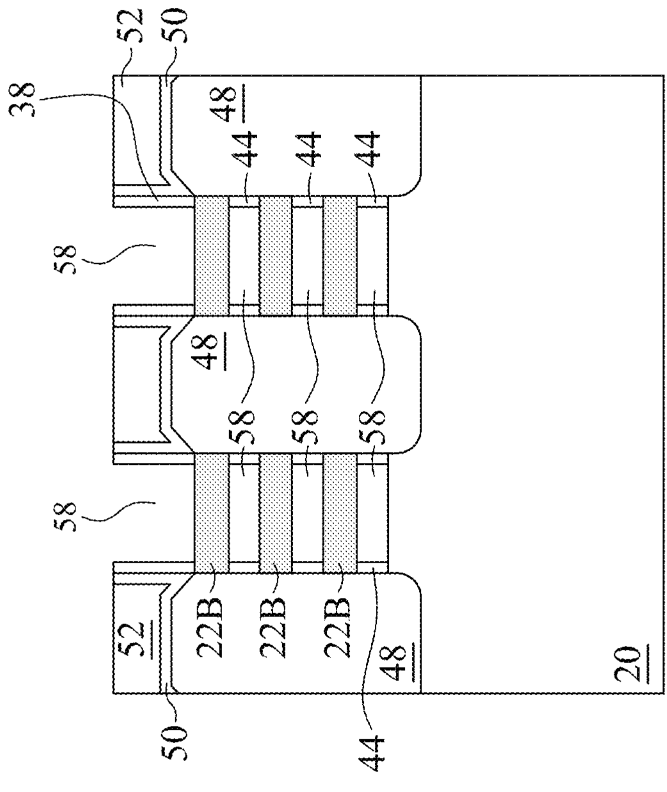
Figure 13A:
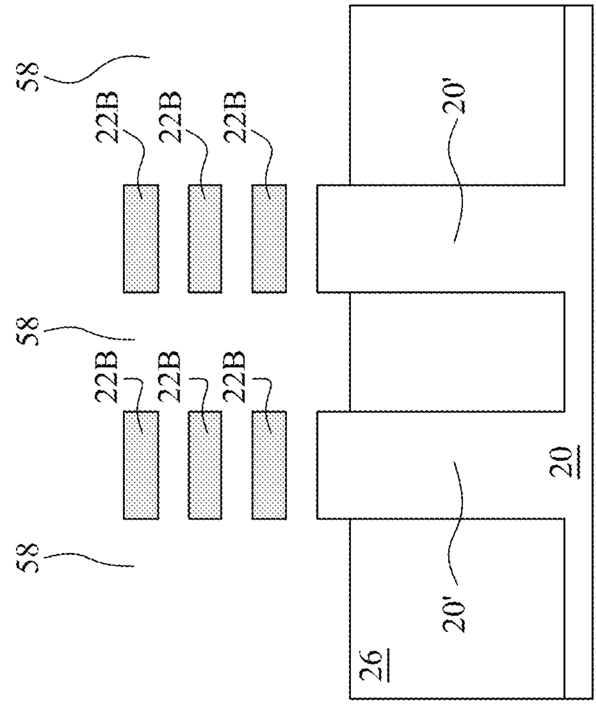

Sacrificial layers 22A are then removed to extend recesses 58 between nanostructures 22B, and the resulting structure is shown in FIGS. 13A and 13B. The respective process is illustrated as process 224 in the process flow 200 shown in FIG. 44. Sacrificial layers 22A may be removed by performing an isotropic etching process such as a wet etching process using etchants which are selective to the materials of sacrificial layers 22A. Nanostructures 22B, substrate 20, STI regions 26 remain relatively un-etched as compared to sacrificial layers 22A. In accordance with some embodiments in which sacrificial layers 22A include, for example, SiGe, and nanostructures 22B include, for example, Si or SiC, tetra methyl ammonium hydroxide (TMAH), ammonium hydroxide ($NH_4OH$), or the like may be used to remove sacrificial layers 22A.

Figure 14:
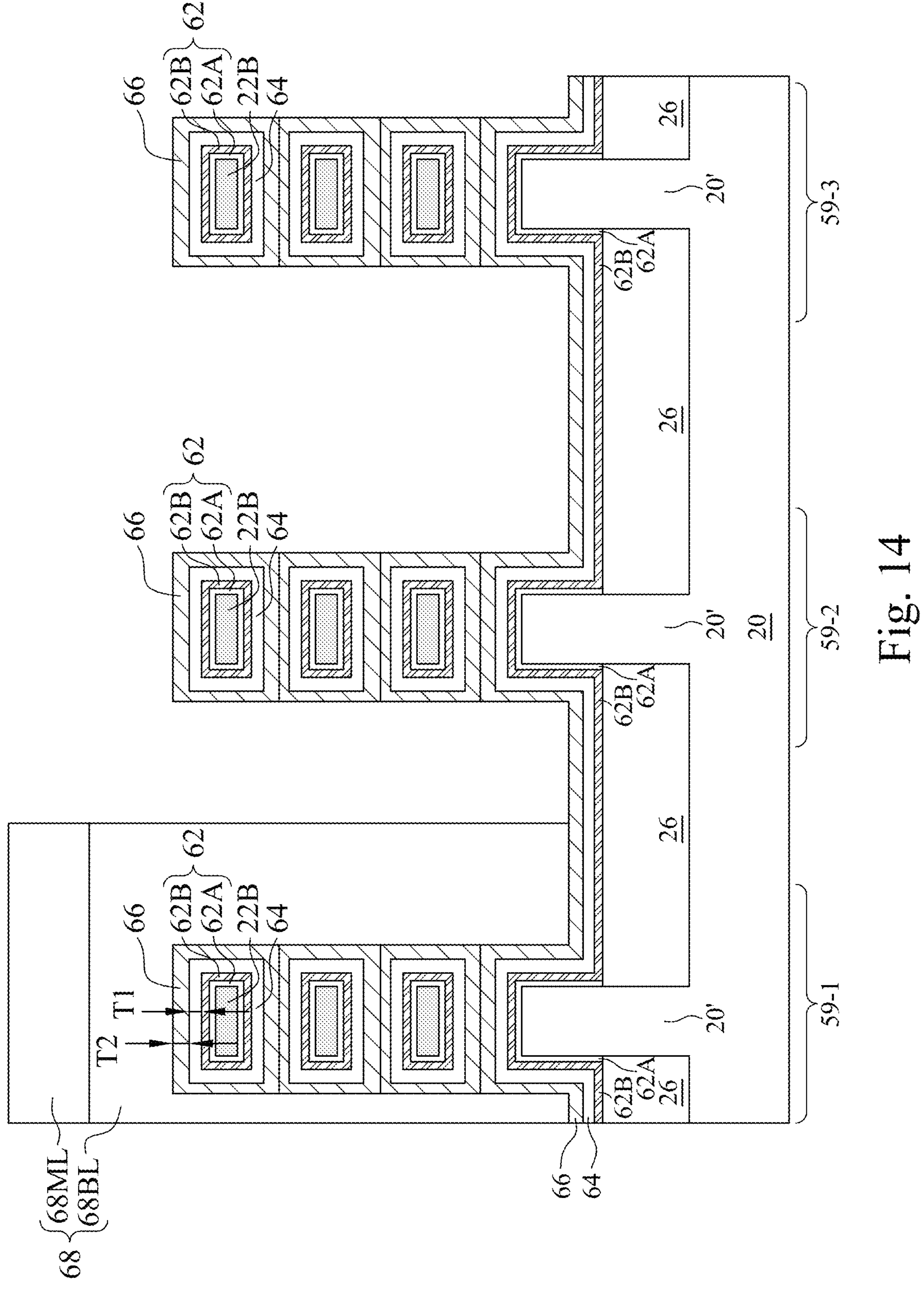

The preceding processes may be used for forming multiple GAA transistors. In subsequent discussion, three device regions are illustrated, each for forming a transistor therein. For example, FIG. 14 illustrates three device regions 59-1, 59-2, and 59-3, and the structures shown therein are formed using the processes as discussed in preceding paragraphs. Each of device regions 59-1, 59-2, and 59-3 may be an n-type transistor region or a p-type transistor region in any combination. In the subsequently discussed examples, it is assumed that device regions 59-1, 59-2, and 59-3 are all p-type transistor regions for the simplicity of discussion.

Referring to FIG. 14, gate dielectrics 62 are formed. The respective process is illustrated as process 226 in the process flow 200 shown in FIG. 44. In accordance with some embodiments, each of gate dielectrics 62 includes interfacial layer 62A and high-k dielectric layer 62B on the interfacial layer 62A. The interfacial layer 62A may be formed of or comprises silicon oxide, which may be deposited through a conformal deposition process such as ALD or CVD. In accordance with alternative embodiments, interfacial layer 62A is formed through thermal oxidation. When formed through thermal oxidation, the portions of interfacial layer 62A on the top surfaces of STI regions 26 will not be formed. In accordance with some embodiments, the high-k dielectric layers 62B comprise one or more dielectric layers. For example, the high-k dielectric layer(s) 62B may include a metal oxide or a silicate of hafnium, aluminum, zirconium, lanthanum, manganese, barium, titanium, lead, combinations thereof, and/or multi-layers thereof.

Further referring to FIG. 14, dipole dopant film 64 is deposited on gate dielectric 62 through a conformal deposition process such as CVD, ALD, or the like. The respective process is illustrated as process 228 in the process flow 200 shown in FIG. 44. Dipole dopant film 64 may include a p-type dopant, which when incorporated into the gate dielectrics of p-type transistors, may increase the effective work functions and hence reduce the threshold voltages of the corresponding p-type transistors. When incorporated into the gate dielectrics of n-type transistors, the p-type dopant may increase the effective work functions and hence increase the threshold voltages of the corresponding n-type transistors. In accordance with some embodiments, the p-type dopant may include aluminum (Al), zinc (Zn), and/or the like. In accordance with some other embodiments, Dipole dopant film 64 may include an n-type dopant such as La, Sr, Y, Er, Sc, Mg, or the like, or combinations thereof. The effect of the n-type dipole dopant to the effective work functions and the threshold voltages of the n-type and p-type transistors are opposite to that of the p-type dipole dopant.

In accordance with some embodiments, when the dipole dopant film 64 comprises aluminum as a p-type dipole dopant, aluminum may be in the form of a compound such as aluminum nitride (as deposited). The thickness T1 of dipole dopant film 64 may be in the range between about 5 Å and about 20 Å.

Hard mask 66 may be deposited conformally on dipole dopant film 64. The respective process is illustrated as process 230 in the process flow 200 shown in FIG. 44. In accordance with some embodiments, hard mask 66 comprises aluminum oxide (AlO, which may comprise $Al_2O_3$). Hard mask 66 may be deposited through a conformal deposition process such as CVD, ALD, or the like. The thickness T2 of hard mask 66 may be in the range between about 5 Å and about 30 Å. Thickness T2 may also be smaller than thickness T1, so that the dipole dopant films 64 on the neighboring nanostructures 22B may be merged. Although FIG. 14 and the subsequent FIGS. 18 and 24-26 illustrate that the dipole dopant films 64 on the neighboring nanostructures 22B are separated from each other, they may also merge with each other. This may also desirably improve the amount of diffused dipole dopant into the high-k dielectric layers 62B. The total thickness T1+T2 of dipole dopant film 64 and hard mask 66 may be in the range between about 10 Å and about 35 Å.

Hard mask 66 may have either one or both of the following functions. It may be used as a hard mask for etching dipole dopant film 64. It may also help to catch nitrogen in the subsequent dipole drive-in process, so that the nitrogen in the dipole dopant film 64 does not adversely diffuse into the underlying high-k dielectric layers 62B. In addition, the formation of the hard mask 66 that comprises aluminum oxide may convert at least some of the dipole dopant film 64 into AlON, and the oxygen in the dipole dopant film 64 also has the function of catching nitrogen and preventing the nitrogen atoms from diffusing into the underlying high-k dielectric layers 62B.

Figure 31:
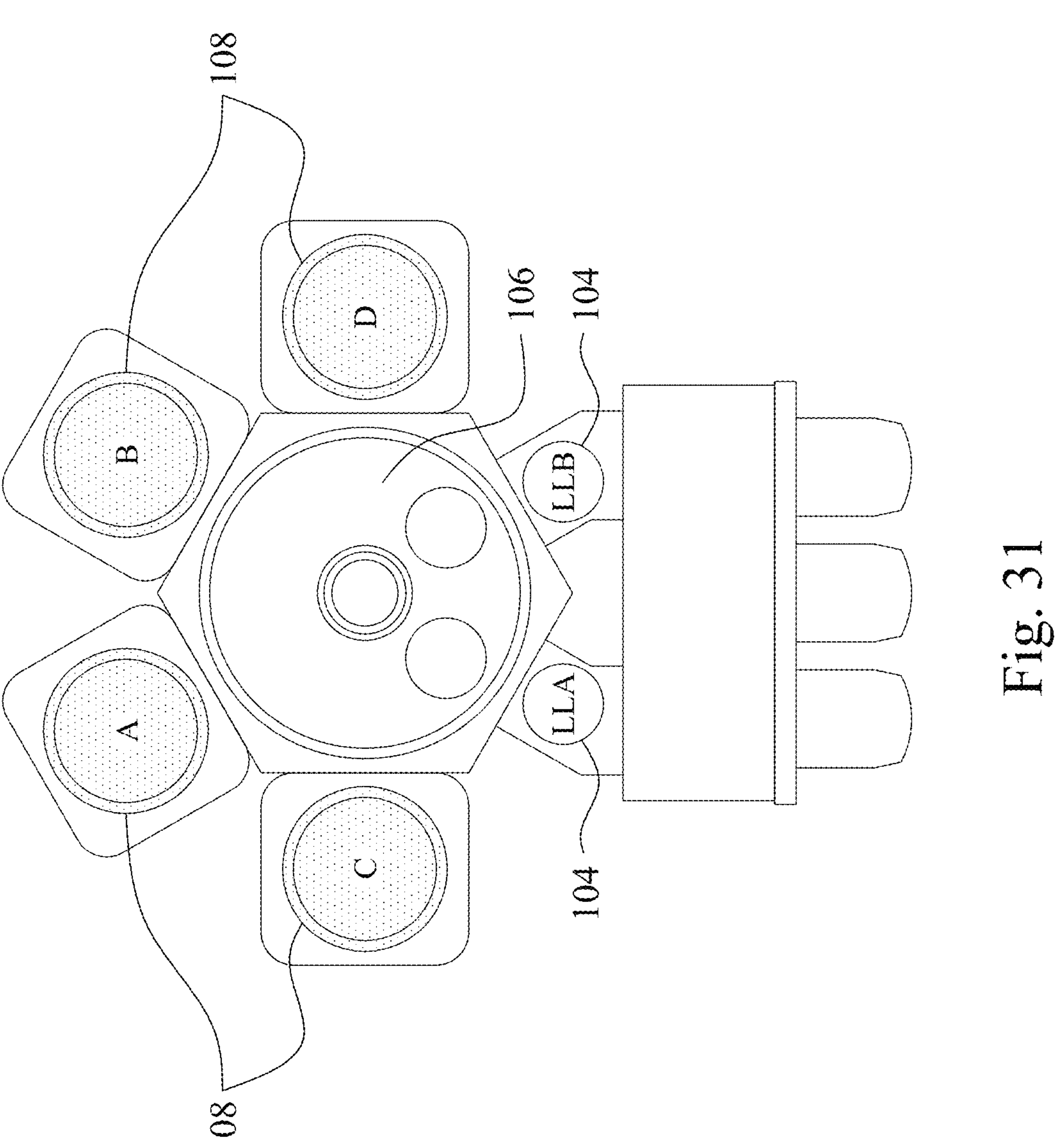
FIGS. 31-33 illustrate the tools for ex-situ and in-situ AlN and AlO film deposition processes in accordance with some embodiments.

Dipole dopant film 64 and hard mask 66 may be formed through an ex-situ process or an in-situ process. In accordance with some embodiments, dipole dopant film 64 and hard mask 66 are formed through an ex-situ process using the tools shown in FIGS. 31 and 32. Referring to FIG. 31, a deposition tool 102 is provided as an example for depositing dipole dopant film 64 (AlN). The deposition tool 102 includes load-locks 104 for loading wafers, buffer 106 for transiting wafers, and a plurality of deposition chambers 108, each may be used for depositing dipole dopant film 64 on a wafer. Deposition tool 102 may be a CVD chamber, an ALD chamber, or the like.

After dipole dopant film 64 is deposited in deposition tool 102, the corresponding wafer is removed out of deposition tool 102 through a vacuum-break process, and is exposed to air. As a result, the oxygen and moisture in the air may oxidize dipole dopant film 64. When dipole dopant film 64 comprises AlN, either the outer surface part or the entirety of dipole dopant film 64 is oxidized to form AlON. The inner part of dipole dopant film 64 may be oxidized to form AlON, or may remain as AlN.

Figure 32:
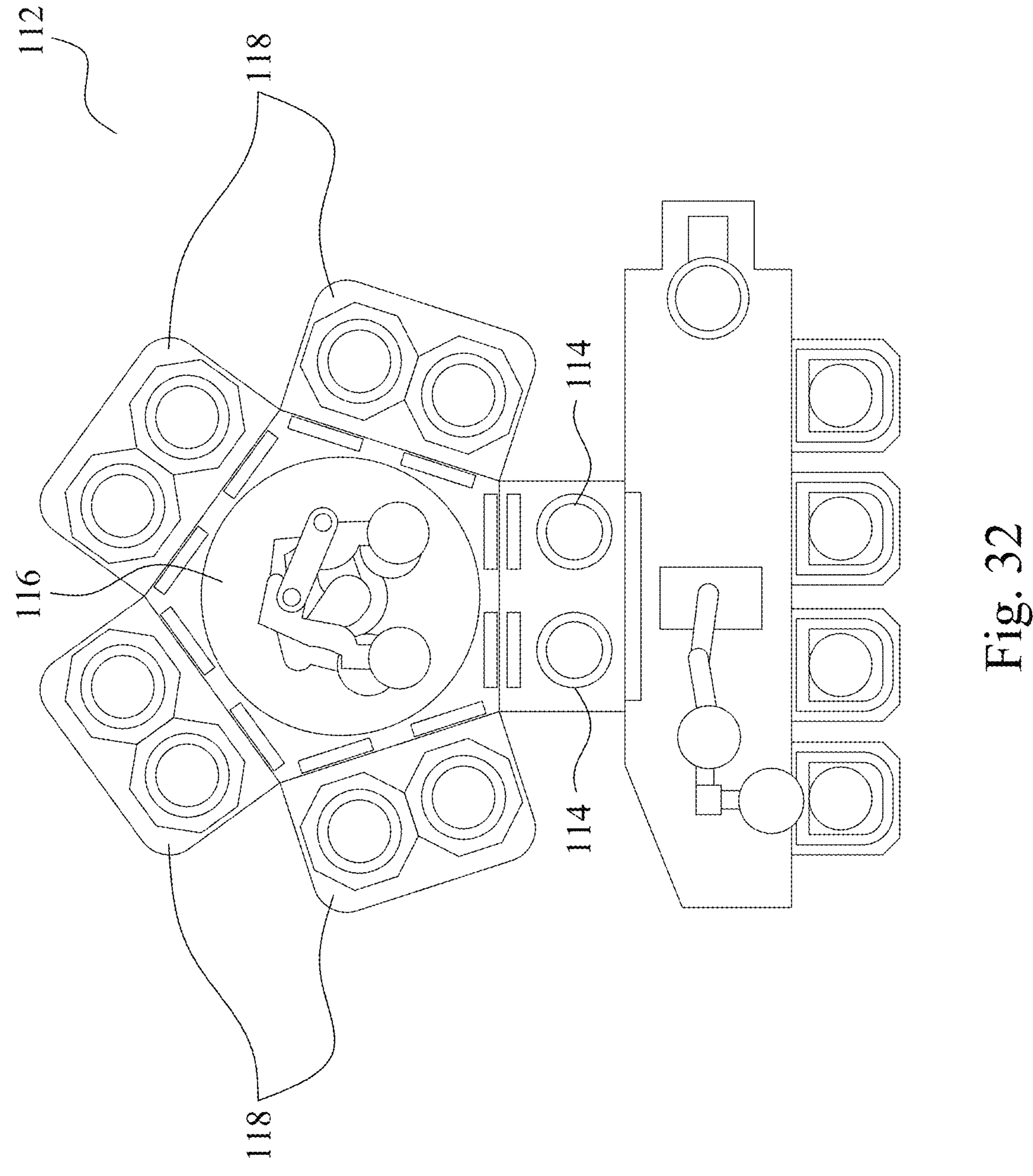

FIG. 32 illustrates the deposition tool 112 for depositing hard mask 66 (which may comprise AlO, for example). The deposition tool 112 includes load-locks 114 for loading wafers, buffer 116 for transiting wafers, and a plurality of deposition chambers 118, each may be used for depositing hard mask 66. Since the deposition of AlO involves an oxygen-comprising gas or a water-comprising gas, the dipole dopant film 64 may be oxidized, for example, forming AlON. When dipole dopant film 64 comprises AlN, either the outer surface part or the entirety of dipole dopant film 64 is oxidized to form AlON. The inner part of dipole dopant film 64 may be oxidized to form AlON, or may remain as AlN.

Figure 33:
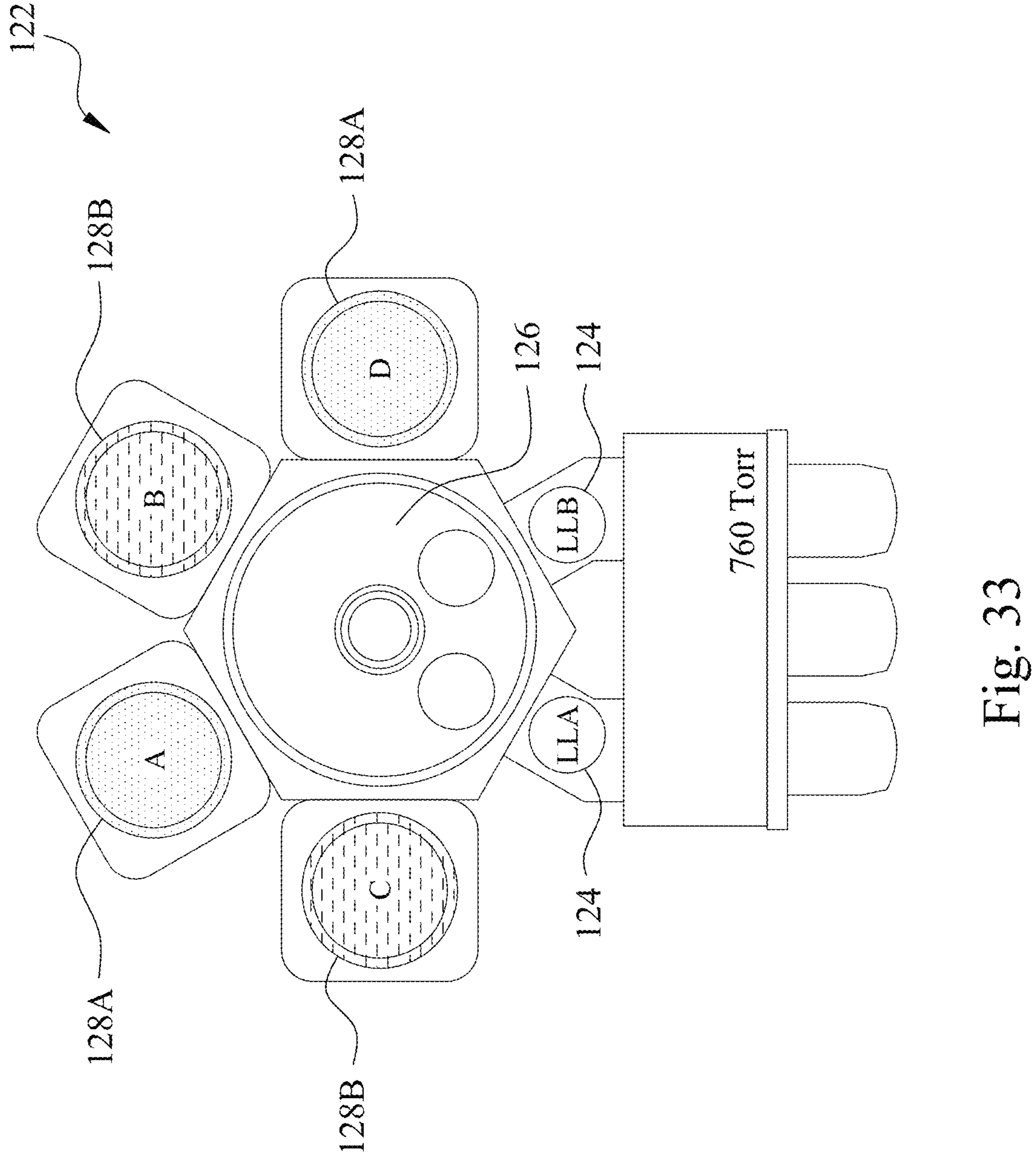

In accordance with alternative embodiments, instead of performing the ex-situ deposition processes, dipole dopant film 64 and hard mask 66 are deposited through an in-situ deposition process. The in-situ deposition process may be performed using deposition tool 122 as shown in FIG. 33. Deposition tool 122 may include load-locks 124 for loading wafers, buffer 126 for transiting wafers, a plurality of deposition chambers 128A, each may be used for depositing dipole dopant film 64, and a plurality of deposition chambers 128B, each may be used for depositing a hard mask 66 such as AlO.

In the in-situ deposition process, dipole dopant film 64 is first deposited in one of the deposition chambers 128A, followed by depositing the hard mask 66 in one of deposition chambers 128B. There is no vacuum break between the deposition of dipole dopant film 64 and its overlying hard mask 66. Since the deposition of AlO involves an oxygen-comprising gas or a water-comprising gas, the dipole dopant film 64 is oxidized, for example, forming AlON. When dipole dopant film 64 comprises AlN, either the outer surface part or the entirety of dipole dopant film 64 is oxidized to form AlON. The inner part of dipole dopant film 64 may be oxidized to form AlON, or may remain as AlN.

Figure 40:
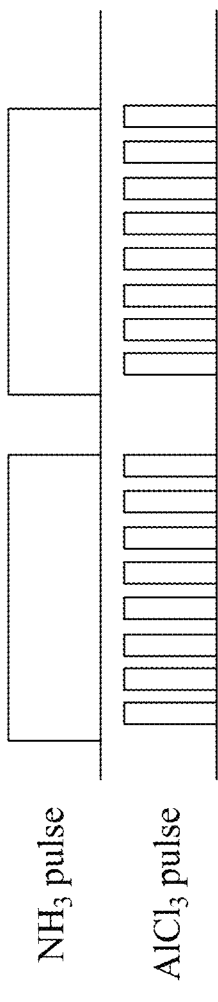
FIG. 40 illustrates a multi-pulse Chemical Vapor Deposition (CVD) process in accordance with some embodiments.

FIG. 40 illustrates an example process for depositing dipole dopant film 64 that comprises AlN in accordance with some embodiments. The deposition may be performed using multi-pulse CVD, while other processes such as single-pulse CVD, ALD, or the like may be used. The deposition may be achieved using a nitrogen-containing precursor and an aluminum-containing precursor. The nitrogen-containing precursor may comprise $NH_3$, $N_2/H_2$, hydrazine ($N_2H_4$), and/or the like. The aluminum-containing precursor may include aluminum trichloride ($AlCl_3$), Trimethylaluminum (TMA), triethylaluminum (TEA) and triTertbutylAluminum (TTBA), and/or the like.

In the multi-pulse CVD, plasma is turned off. As shown in FIG. 40, the deposition of AlN may include one or a plurality of pulsing cycles of the nitrogen-containing precursor (such as $NH_3$). In each pulsing cycle of the nitrogen-containing precursor, the nitrogen-containing precursor is conducted. During a pulsing period of the nitrogen-containing precursor, there are a plurality of pulsing cycles of the aluminum-containing precursor (such as $AlCl_3$), with each cycle including turning-on and then turning-off the flow of the aluminum-containing precursor.

The multi-pulse CVD may help to remove the by-products generated during the deposition of AlN, which by-products may adversely affect the subsequent processes, and may fill the spaces between the nanostructures 22B and adversely prevent AlN from depositing into the spaces. The by-products may include HCl, $NH_2$, $NH_3$, or the like. By adjusting the ratio of the pulsing length of the nitrogen-containing precursor to the pulsing length of the aluminum-containing precursor, the atomic percentage ratio of N/Al may be tuned. For example, longer pulsing of the nitrogen-containing precursor pulsing may increase the atomic percentage ratio N/Al, and longer aluminum-containing precursor pulsing may reduce the atomic percentage ratio N/Al.

The deposition of AlO may be performed using an aluminum-containing precursor, which may be selected from the same group of candidate precursors for depositing AlN, and an oxygen-containing precursor such as $O_2$, $O_3$, $H_2O$, and/or the like. The deposition process may include ALD, CVD, or the like.

Referring back to FIG. 14, a patterned etching mask 68 is formed. In accordance with some embodiments, the patterned etching mask 68 includes bottom layer 68BL, middle layer 68ML, and a top layer (not shown). The top layer may comprise patterned photoresist, and is used to etch middle layer 68ML and bottom layer 68BL, forming the patterned etching mask 68 as shown in FIG. 14. Etching mask 68 has a portion in device region 59-1, and the portions of etching mask 68 in device regions 59-2 and 59-3 are removed.

Figure 15:
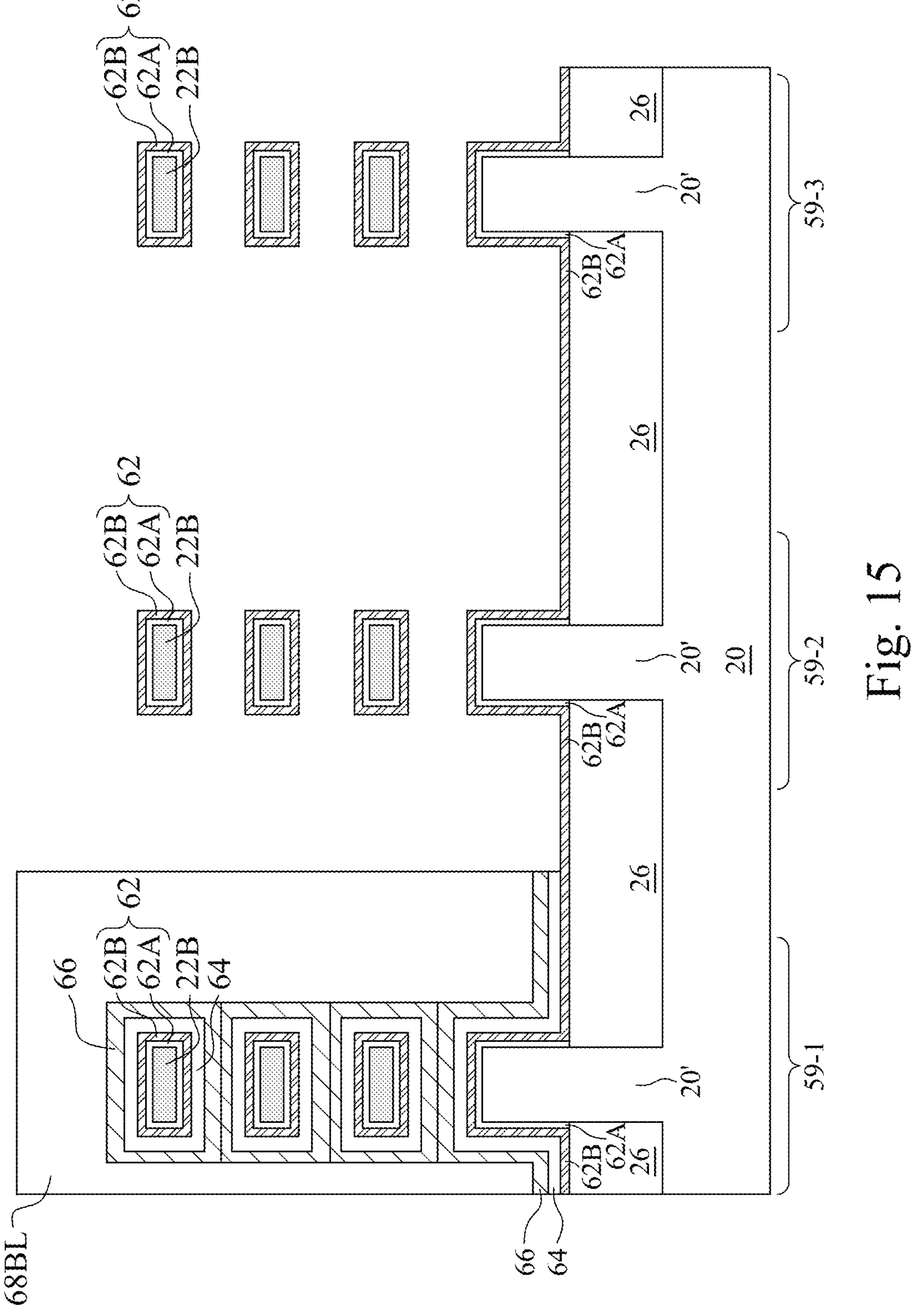

Referring to FIG. 15, an etching/patterning process(es) is performed to etch the portions of hard mask 66 and dipole dopant film 64. The respective process is illustrated as process 232 in the process flow 200 shown in FIG. 44. In the etching, the middle layer 68ML may be consumed, and thus is not shown in FIG. 15. In accordance with some embodiments, as shown in FIG. 15, both of hard mask 66 and dipole dopant film 64 are etched using the patterned etching mask 68 to define patterns. The remaining etching mask 68 is then removed. In accordance with alternative embodiments, the patterned etching mask 68 is used to etch hard mask 66, and is then removed to expose hard mask 66. The patterned hard mask 66 is then used as the etching mask to etch dipole dopant film 64.

Figure 16:
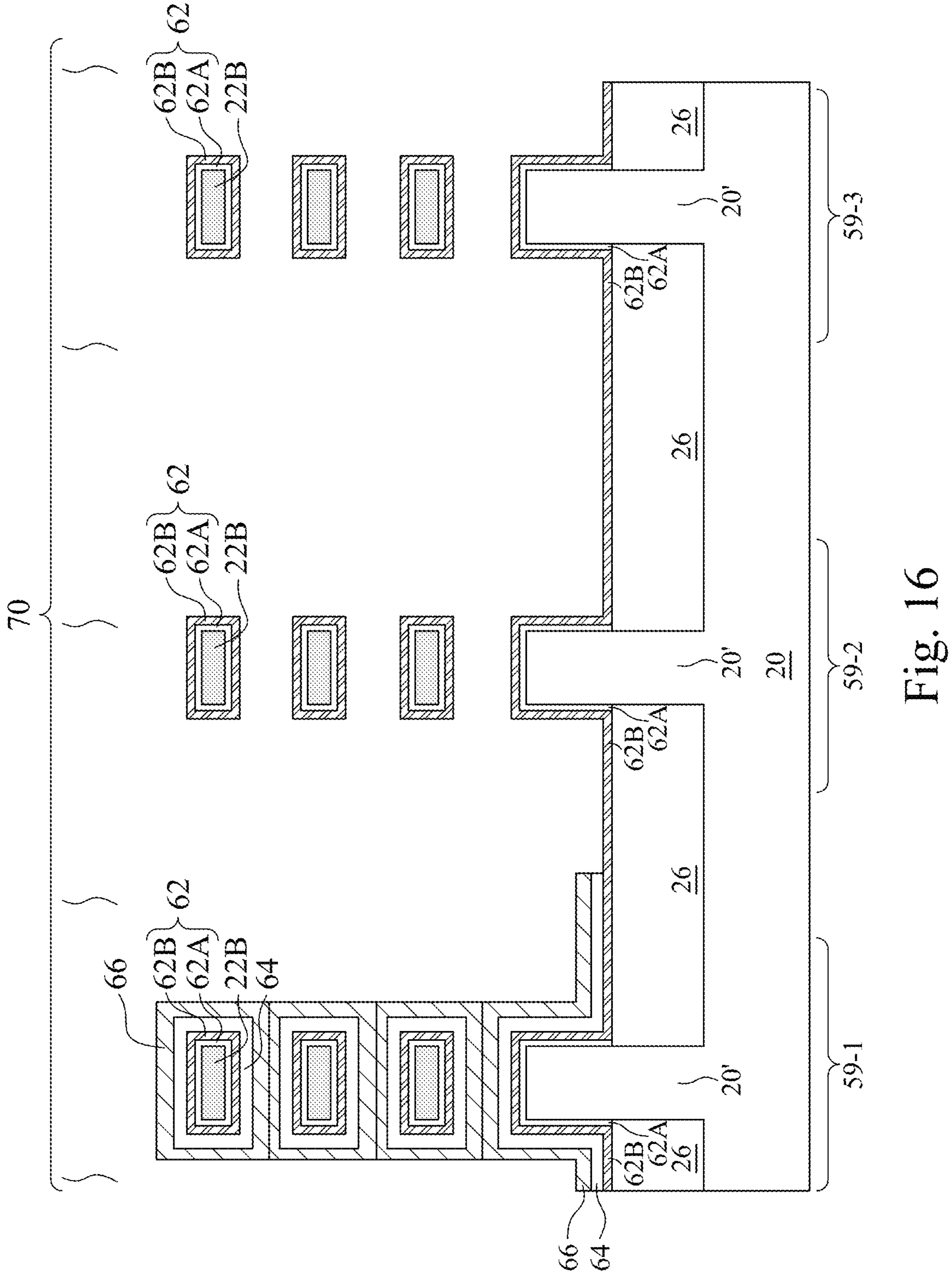

FIG. 16 illustrates drive-in process 70 through an annealing process. The respective process is illustrated as process 234 in the process flow 200 shown in FIG. 44. The drive-in process 70 may be performed in a process gas such as $N_2$, He, $NH_3$, Ar, or the like, or the mixture thereof. In accordance with some embodiments, the drive-in process 70 is performed through a soak anneal process, a spike rapid thermal anneal process, or the like. When the soak anneal process is adopted, the annealing duration may be in the range between about 5 seconds and about 5 minutes. The annealing temperature may be in the range between about 550° C. and about 900° C.

The drive-in process 70 drives the dipole dopant (such as aluminum) in dipole dopant films 64 into the respective underlying high-k dielectric layers 62B in device region 59-1. The threshold voltage of the resulting transistor is thus tuned, for example, reduced for a p-type transistor and increased for an n-type transistor. The using of AlN results improved diffusion rate of Al into high-k dielectric layer 62B. For example, FIGS. 34 through 39 illustrate some results comparing using AlN as the dipole dopant film with the use of AlO as the dipole dopant film.

Figure 34:
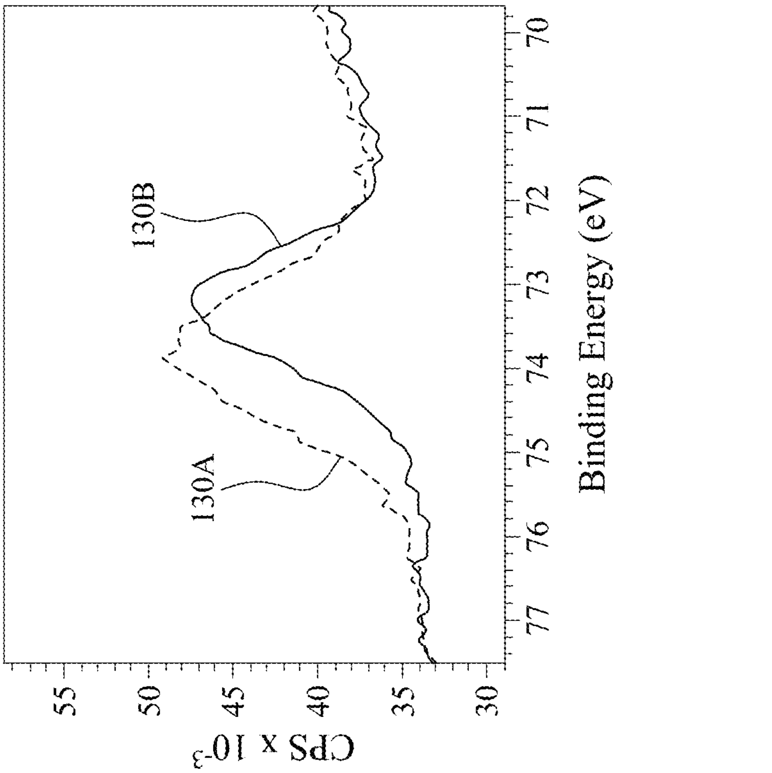

FIG. 34 illustrates the X-ray Photoemission Spectroscopy (XPS) results obtained from AlN and AlO, wherein the Count per Second (CPS) of aluminum signal in high-k dielectric layers (after the drive-in process) is shown as a function of binding energy. Line 130A is the result obtained from AlN, while line 130B is the result obtained from AlO. The results reveal that AlN has a lower binding energy than AlO. Accordingly, in the drive-in process, it is easier to break the Al-N bonds in AlN than to break the Al-O bonds in AlO. Therefore, when an AlN layer and an AlO layer having the same thickness are used for dipole doping, the high-k dielectric layer under the AlN layer will have more aluminum atoms doped than the high-k dielectric layer under the AlO layer.

Figure 35:
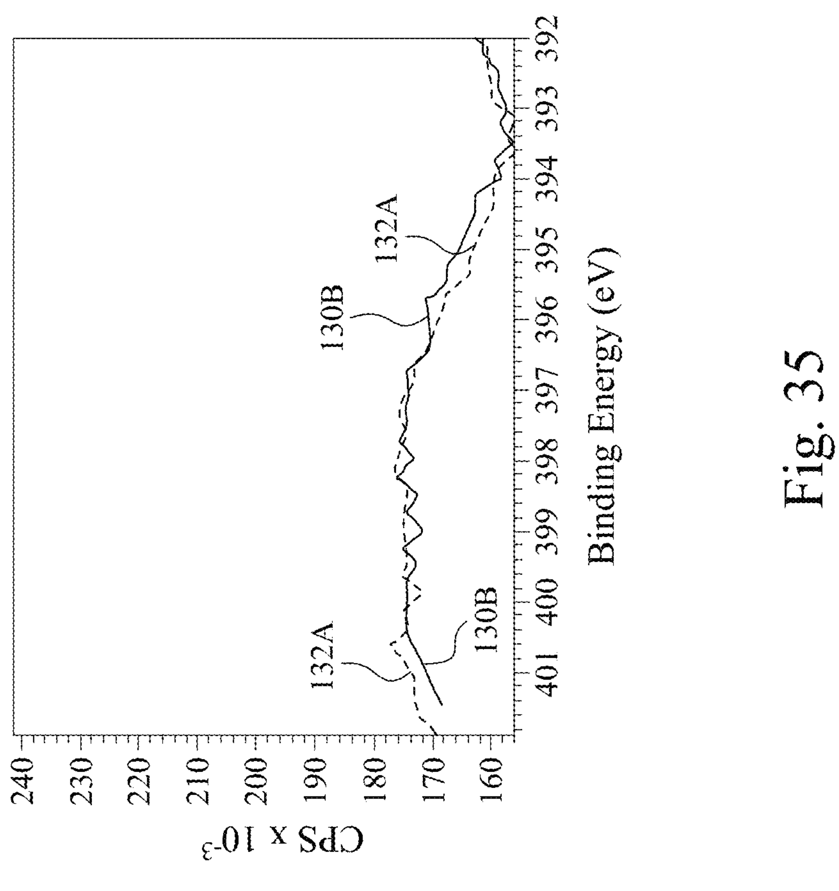
FIGS. 34-39 illustrate the performance data of the transistors formed using AlN dipole dopant films comparing to the transistors formed using AlO dipole dopant films in accordance with some embodiments.

FIG. 35 illustrates the XPS results obtained from AlN and AlO, wherein the CPS of nitrogen signal in high-k dielectric layers (after the drive-in process) is shown as a function of binding energy. Line 132A is the result obtained from AlN, while line 132B is the result obtained from AlO. Line 132A essentially overlaps line 132B. The results reveal that although AlN has more N than AlO, essentially the same amount of N is diffused into the underlying high-k dielectric layers regardless of whether AlN is used or AlO is used. Since nitrogen is undesirable in the high-k dielectric layers due to its degradation to performance, less nitrogen incorporation into the high-k dielectric layers is desirable. Such result may be resulted from the oxygen in the AlON (the oxidized dipole dopant film), which oxygen catches the nitrogen atoms from diffusing into the high-k dielectric layers.

Figure 36:
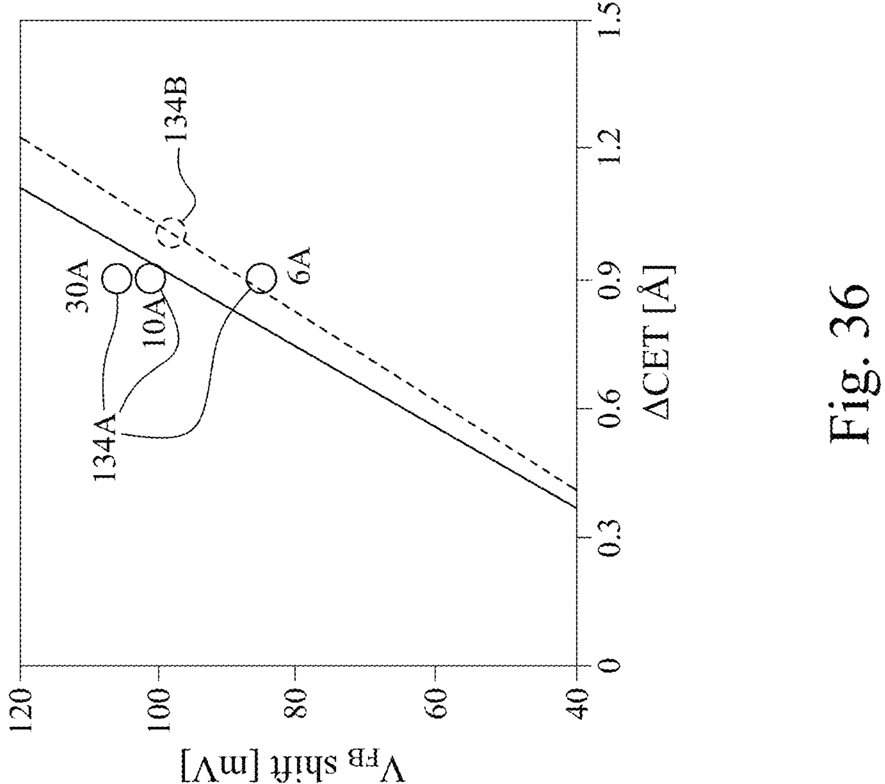

FIG. 36 illustrates the shift of flat-band voltages of AlN and AlO in p-type transistors as a function of the Capacitance Equivalent Thickness (ΔCET). This graph indicates how the thickness-change in the dipole dopant film 64 affects the change in the threshold voltages of the p-type transistors. It shows that if AlO is used, an AlO dipole film having a thickness of about 32.5 Å (point 134B) is needed in order to achieve a shift of about 95 mV in the flat-band voltage. If, on the other hand, AlN is used, the thicknesses of the AlN dipole dopant films would be 6 Å, 10 Å, and 30 Å (points 134A) in order to achieve the shift of about 80 mV, 100 mV, and about 105 mV, respectively in the flat-band voltages. This indicates that the AlN is much more effective in tuning the threshold voltages of the p-type transistors.

Figure 37:
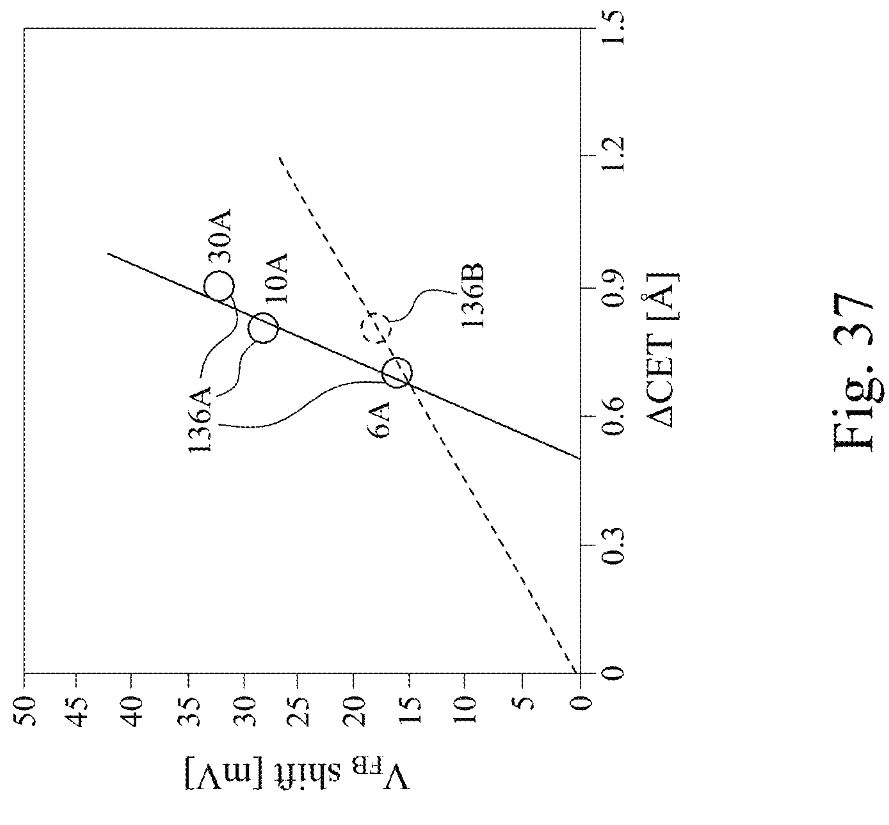

FIG. 37 illustrates the shift of flat-band voltages of AlN and AlO as a function of the ΔCET. FIG. 37 is similar to FIG. 36, except that FIG. 37 shows the results obtained from n-type transistors. This graph indicates how the thickness change in the dipole dopant film 64 affects the change in the threshold voltages of the n-type transistors. It shows that if AlO is used, an AlO dipole film having a thickness of about 32.5 Å (point 136B) is needed in order to achieve a shift of about 16 mV in the flat-band voltage. If, on the other hand, AlO is used, the thicknesses of the AlN dipole dopant films would be 6 Å, 10 Å, and 30 Å (points 136A) in order to achieve the shift of about 15 mV, 27 mV, and about 31 mV, respectively, in the flat-band voltages. This indicates that the AlN is also much more effective in tuning the threshold voltages of the n-type transistors.

Figure 38:
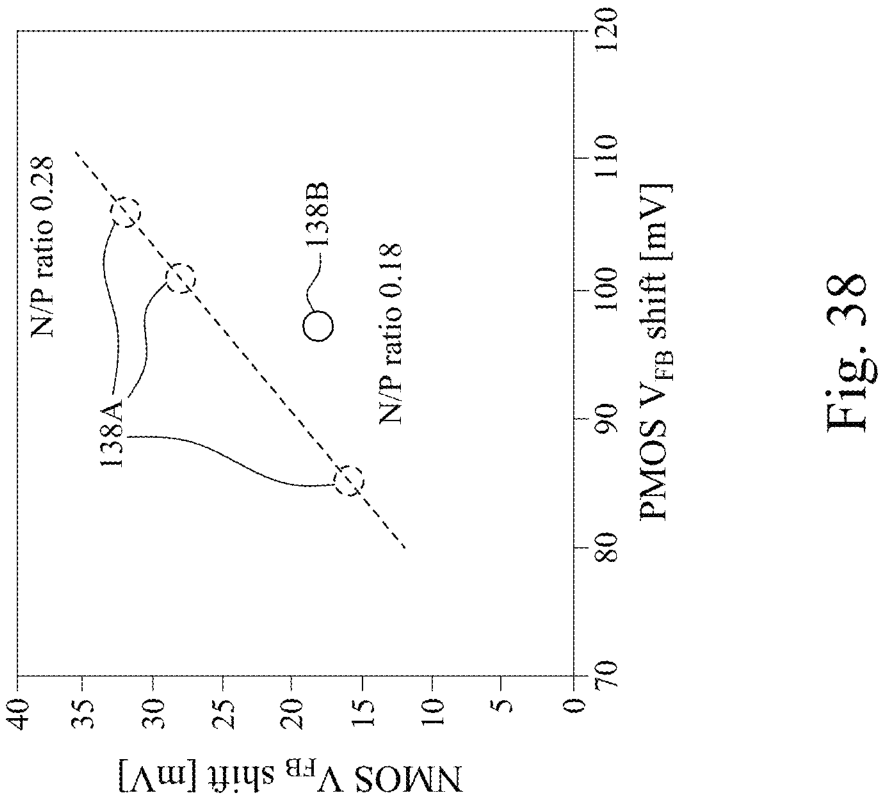

FIG. 38 illustrates the comparison of the shift of flat-band voltages of AlN in p-type transistors to the shift of flat-band voltages of AlN in n-type transistors. FIG. 38 shows that if AlO is used (point 138B), the ratio of the shift in the flat-band voltage (which affects the threshold voltage) in n-type transistor to the shift in the flat-band voltages in p-type transistors is about 0.18. If AlN is used (points 138A), the ratio of the shift in the flat-band voltage in n-type transistor to the shift in the flat-band voltages in p-type transistors (points 138A) is about 0.28. This indicates that AlN is better than AlO since when AlN is used, the tuning of the threshold voltages of the n-type transistors is closer to (although still smaller than) the tuning of the threshold voltages of the p-type transistors.

Figure 39:
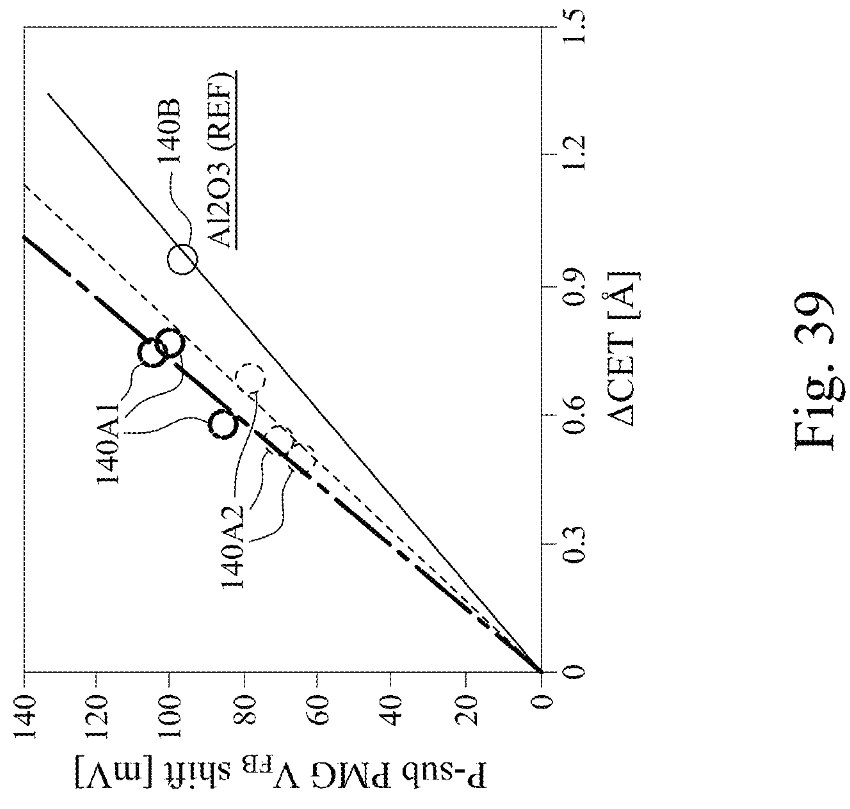

FIG. 39 illustrates the comparison of the shift of flat-band voltages of AlN and AlO using ex-situ deposition to the shift of flat-band voltages of AlN and AlO using in-situ deposition. The dots 140A1 are obtained when AlN and AlO are in-situ deposited, and the dots 140A2 are obtained when AlN and AlO are ex-situ deposited. Dot 140B is obtained with AlO alone being used as the dipole film. The results indicate that the ex-situ deposition and the in-situ deposition have similar results, with the ex-situ deposition have slightly higher shift of flat-band voltages.

Figure 17:
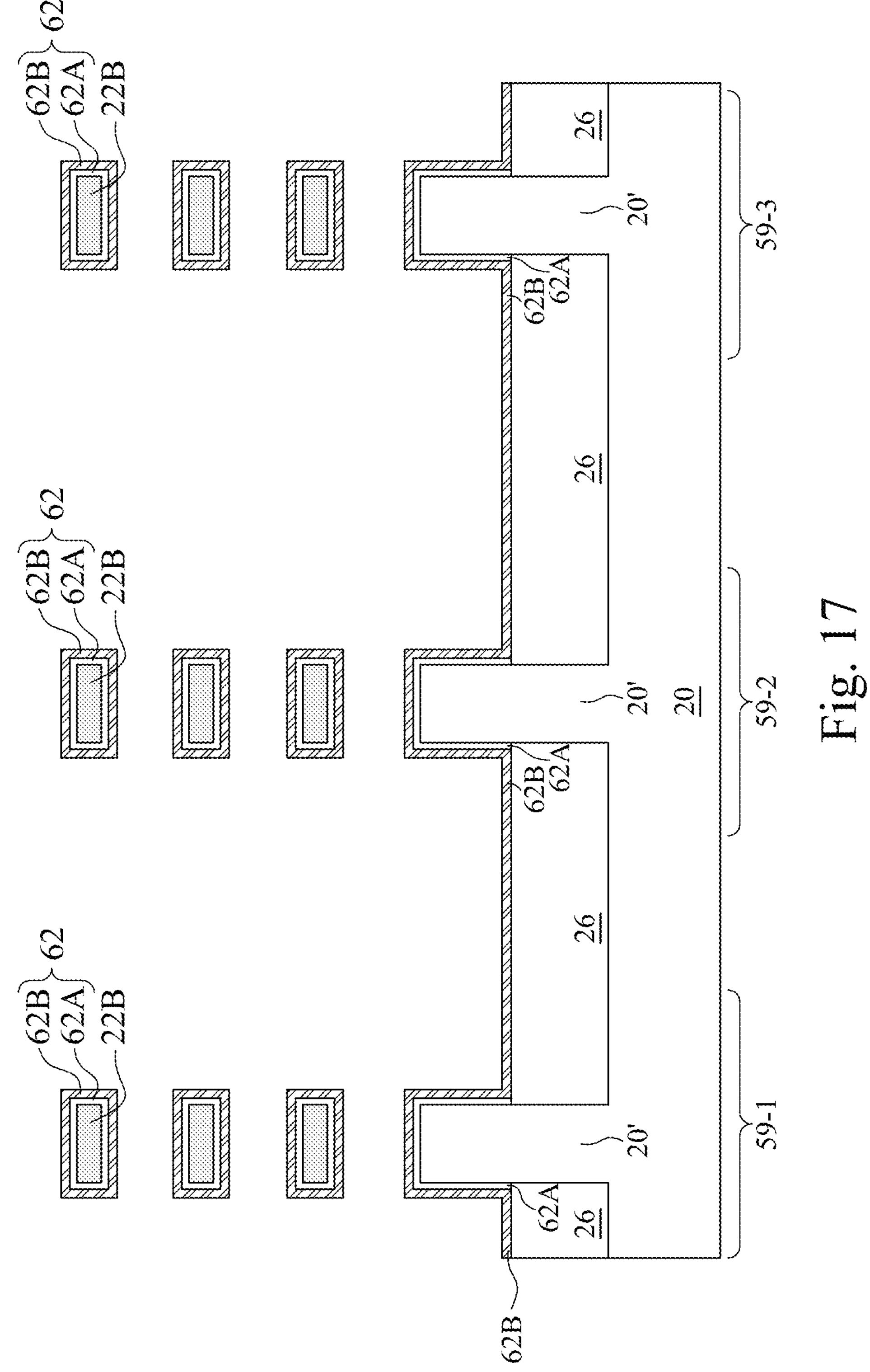

After the drive-in of the dipole dopant, the hard mask 66 and dipole dopant film 64 as shown in FIG. 16 are removed in etching processes, and the resulting structure is shown in FIG. 17. The respective process is illustrated as process 236 in the process flow 200 shown in FIG. 44. The processes shown in FIGS. 14 through 17 are collectively referred to as a first dipole-dopant-incorporation process.

FIGS. 18 through 21 illustrate a second dipole-dopant-incorporation process in accordance with some embodiments. The processes, structures, and the materials in the second dipole-dopant-incorporation process are essentially the same as that used in the first dipole-dopant-incorporation process, except that in this process, the dipole dopant is doped into the high-k dielectric layers 62B in both of device regions 59-1 and 59-2, rather than into device region 59-1 alone. Accordingly, more dipole dopants are doped into the high-k dielectric layers 62B in the device region 59-1, and hence the tuning of the work-function and the threshold voltages of the transistor in device region 59-1 is increased, and is greater than the tuning of the work-function and the threshold voltages of the transistor in device region 59-2. The processes are discussed briefly herein, and the details may be found in the discussion of the processes shown in FIGS. 14-17.

Figure 18:
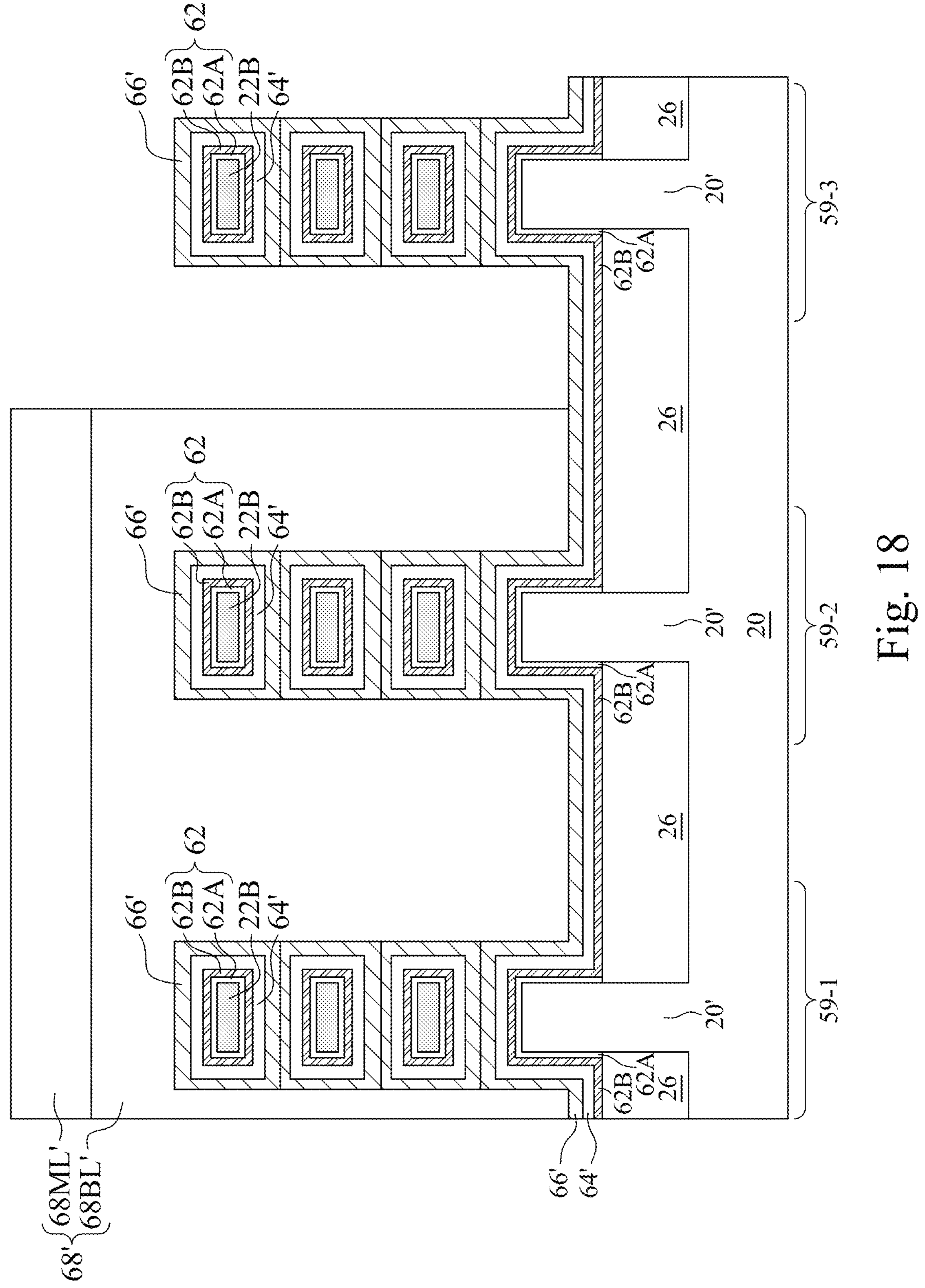

FIG. 18 illustrates the deposition of dipole dopant film 64' and hard mask 66', and the formation of the etching mask 68', which includes bottom layer 68BL' and middle layer 68ML'. The respective process is illustrated as processes 238 and 240 in the process flow 200 shown in FIG. 44. Etching mask 68' covers the portions of the dipole dopant film 64' and hard mask 66' in device regions 59-1 and 59-2, and leaves device region 59-3 open.

Figure 19:
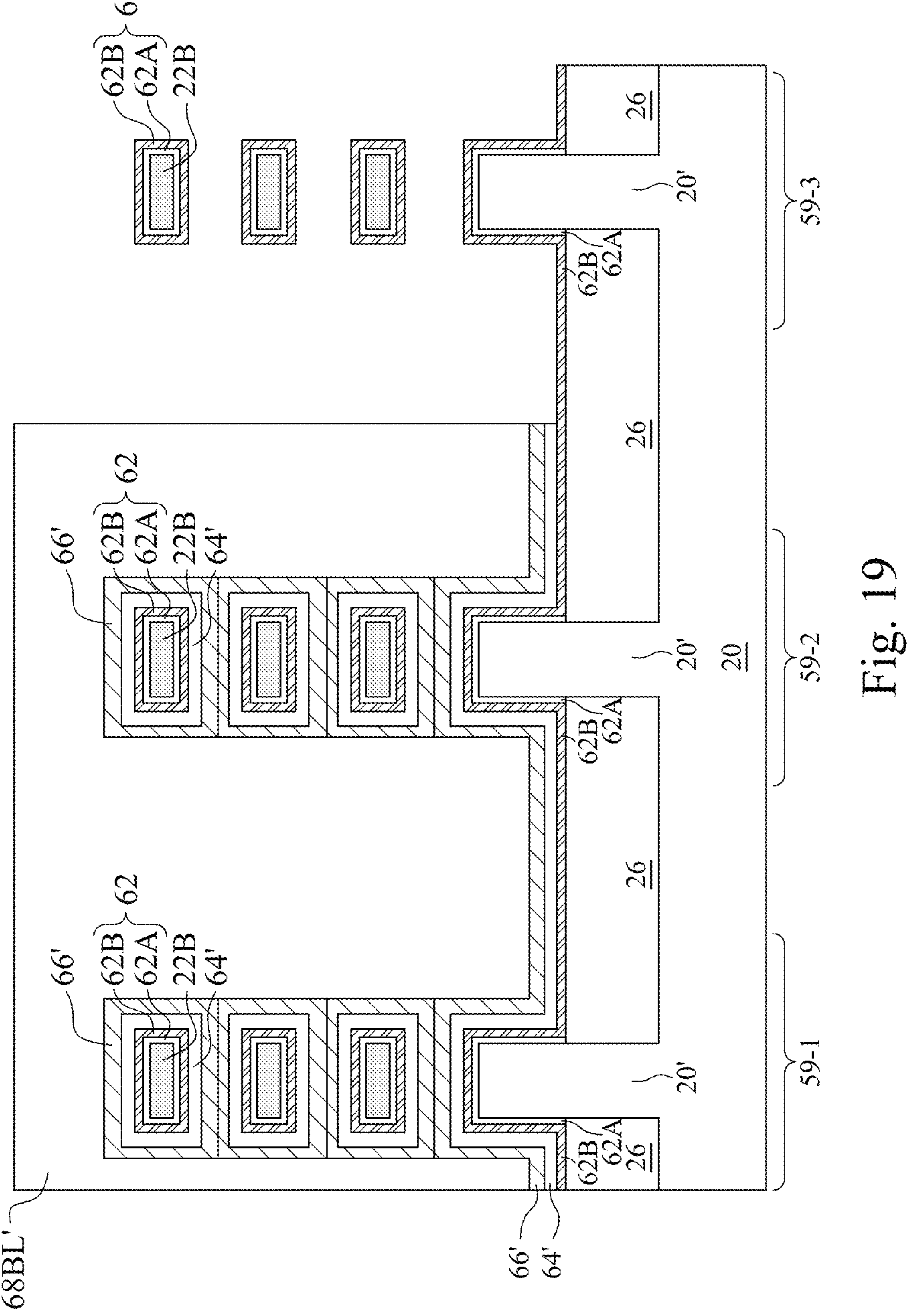
Figure 20:
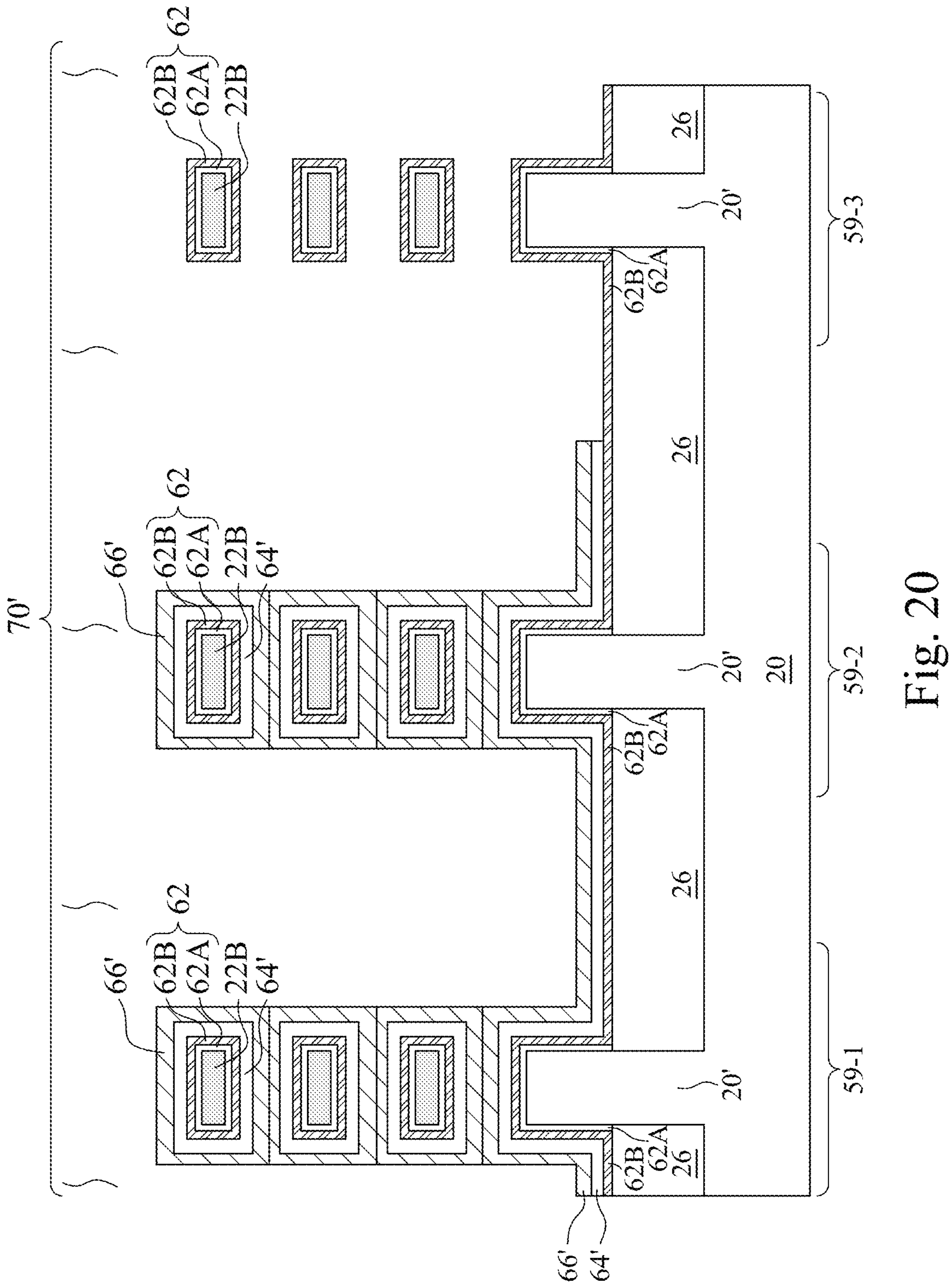

Next, as shown in FIG. 19, the dipole dopant film 64' and hard mask 66' are patterned, and their portions in device region 59-3 are removed in an etching process. The respective process is illustrated as process 242 in the process flow 200 shown in FIG. 44. Etching mask 68', if any left, may be removed. Hard mask 66' may also be removed. Next, as shown in FIG. 20, drive-in process 70' is performed to drive the dipole dopant into the portions of the high-k dielectric layers 62B in both of device regions 59-1 and 59-2. The respective process is illustrated as process 244 in the process flow 200 shown in FIG. 44. The details of drive-in process 70' may be essentially that same as that of drive-in process 70.

Figure 21:
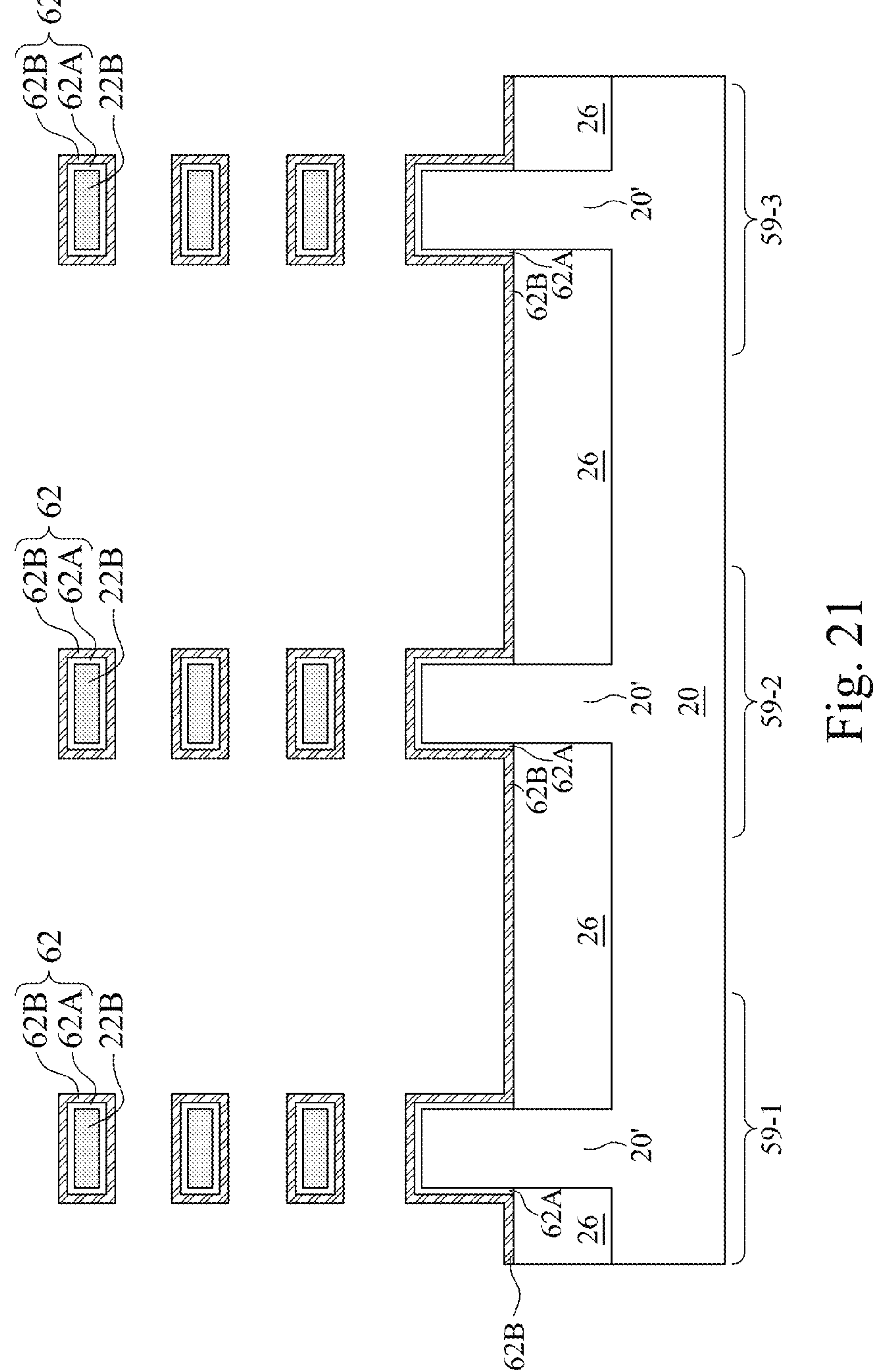

Since the portion of the high-k dielectric layer 62B in device region 59-1 already has the dipole dopant incorporated in the first dipole-dopant-incorporation process, the concentration of the dipole dopant in the device region 59-1 is increased higher than that in device region 59-2. In device region 59-3, no dipole dopant is doped into the corresponding portion of the high-k dielectric layer 62B. After the drive-in process 70', dipole dopant film 64' and hard mask 66' are removed in an etching process(es). The respective process is illustrated as process 246 in the process flow 200 shown in FIG. 44. The resulting structure is shown in FIG. 21.

Figure 22:
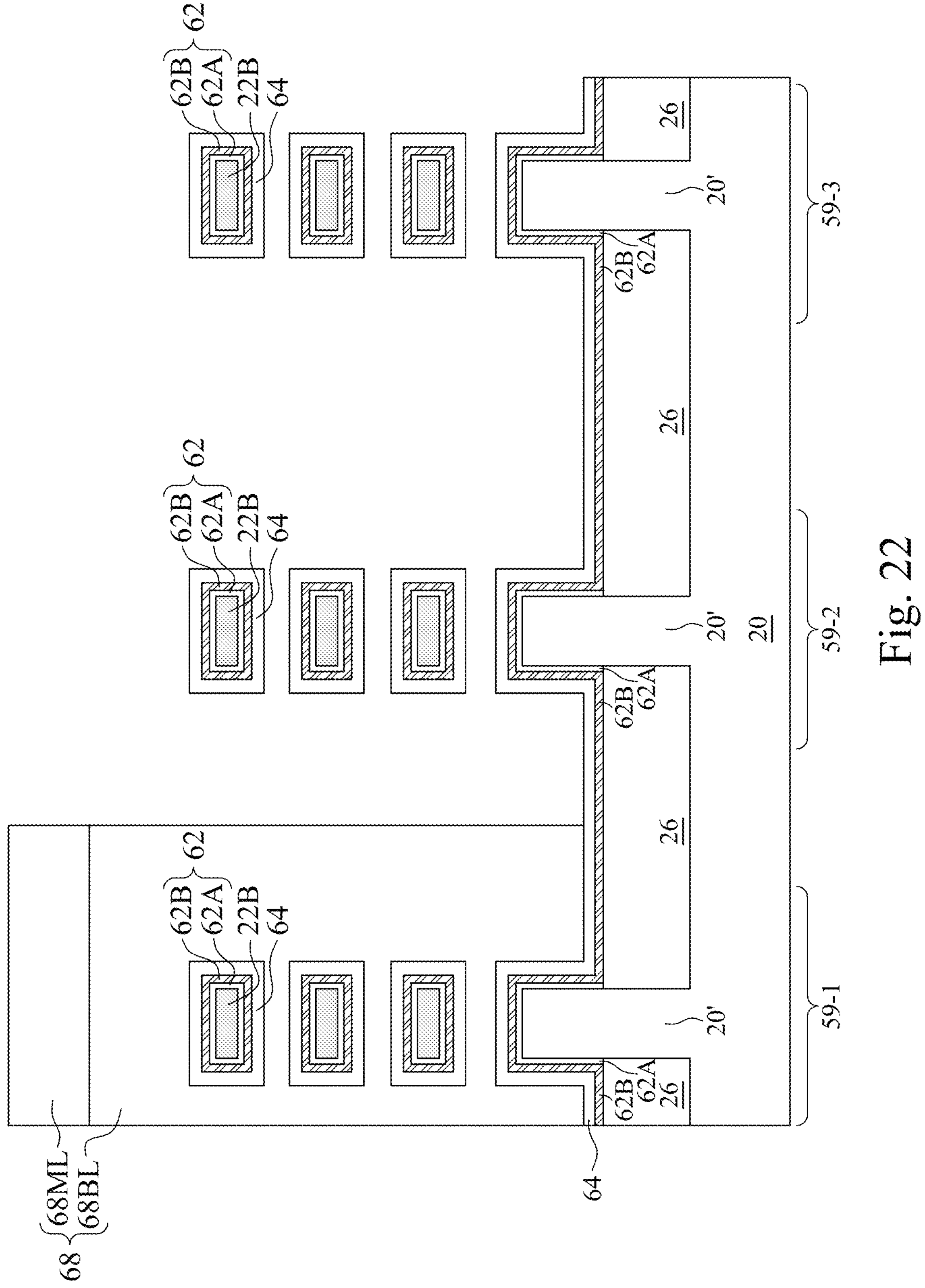
Figure 23:
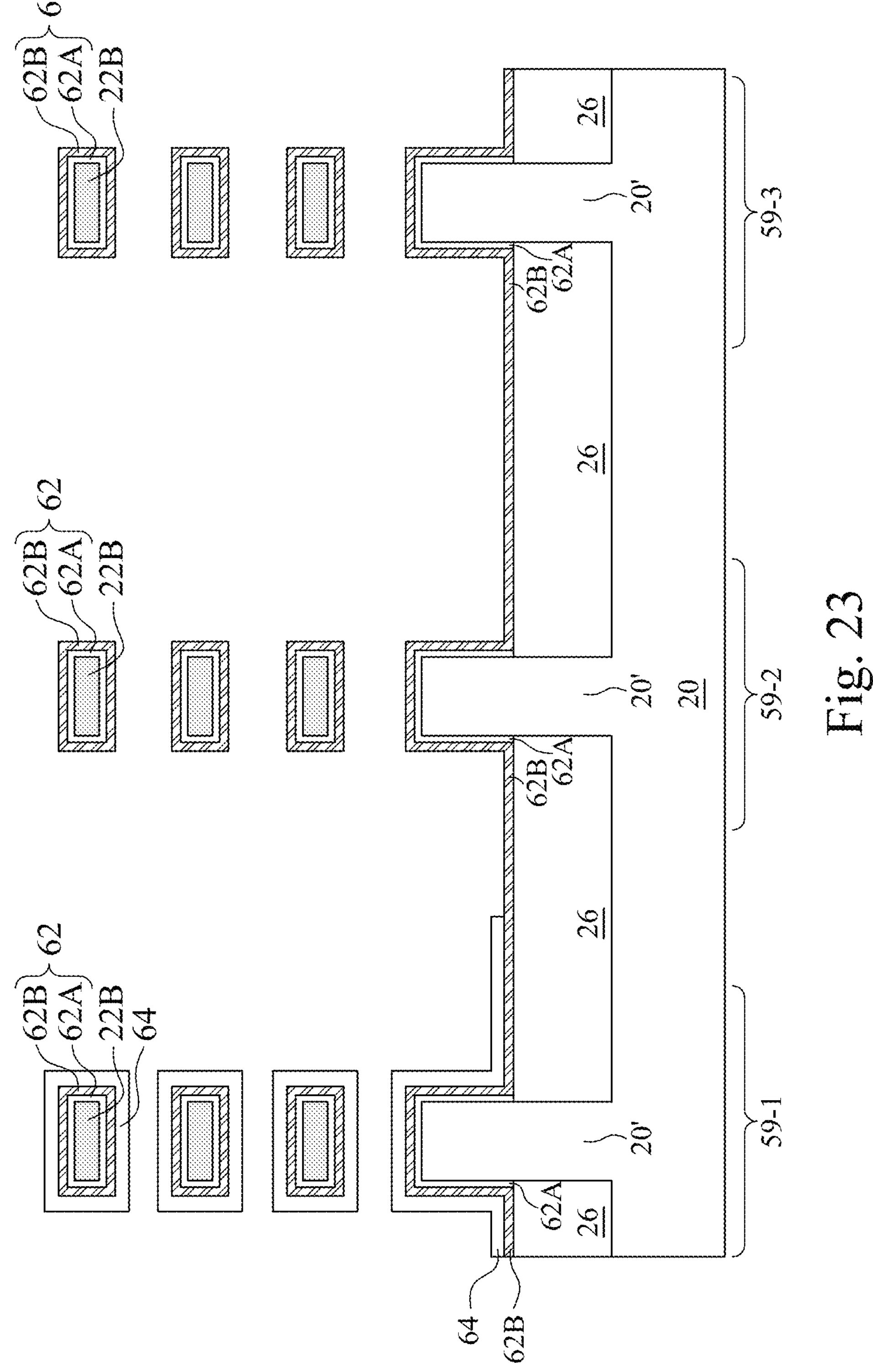
Figure 24:
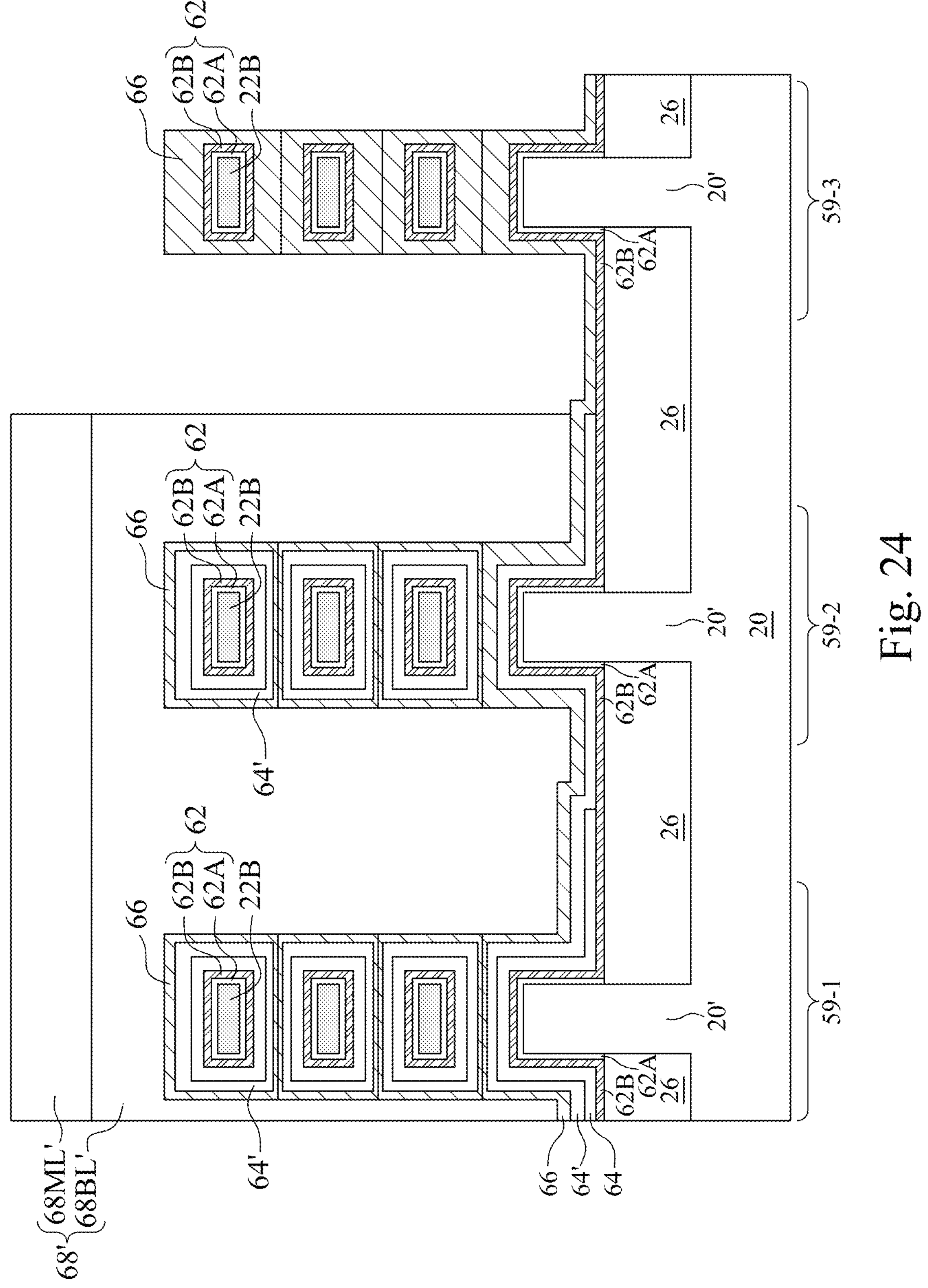

FIGS. 22 through 24 illustrate the dipole-dopant-incorporation processes in accordance with alternative embodiments. These embodiments are similar to the embodiments in FIGS. 14 through 21, except that instead of driving-in dipole dopants after the deposition of each dipole dopant film and then removing the dipole dopant film, the drive-in process is performed after all dipole dopant films are deposited, and all dipole dopant films are removed in a same removal process.

FIG. 22 illustrates the formation of dipole dopant film 64, and the formation of etching mask 68 (including bottom layer 68BL and middle layer 68ML) in accordance with some embodiments. Hard mask is not formed at this time. Next, the dipole dopant film 64 is patterned, as shown in FIG. 23. Etching mask 68 is removed.

Figure 25:
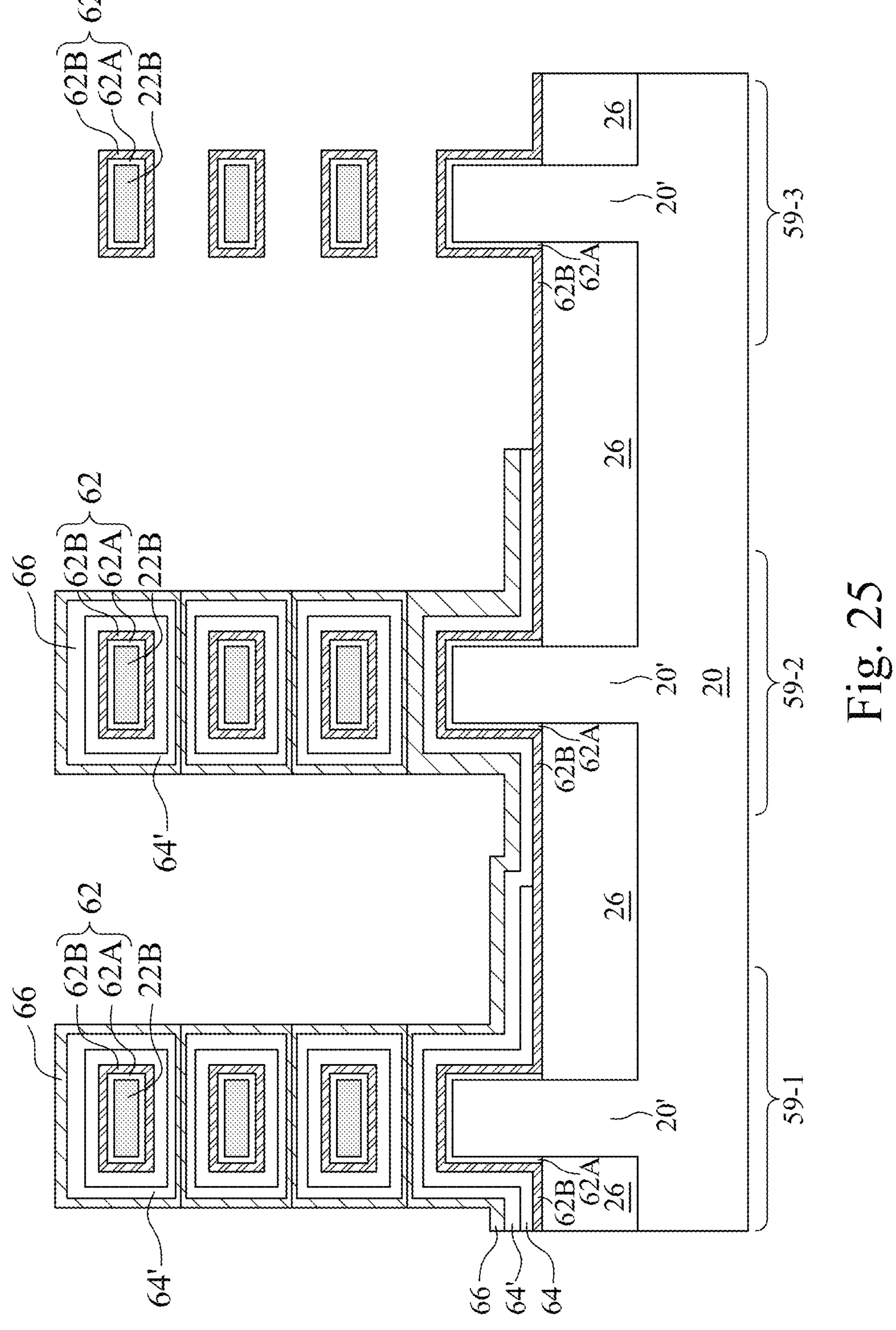

FIG. 24 illustrates the deposition of dipole dopant film 64' and hard mask 66. Etching mask 68' is then formed to cover device regions 59-1 and 59-2. A patterning process is then performed to etch the portions of dipole dopant film 64' in device region 59-3, followed by the removal of the remaining etching mask 68'. The resulting structure is shown in FIG. 25.

Figure 26:
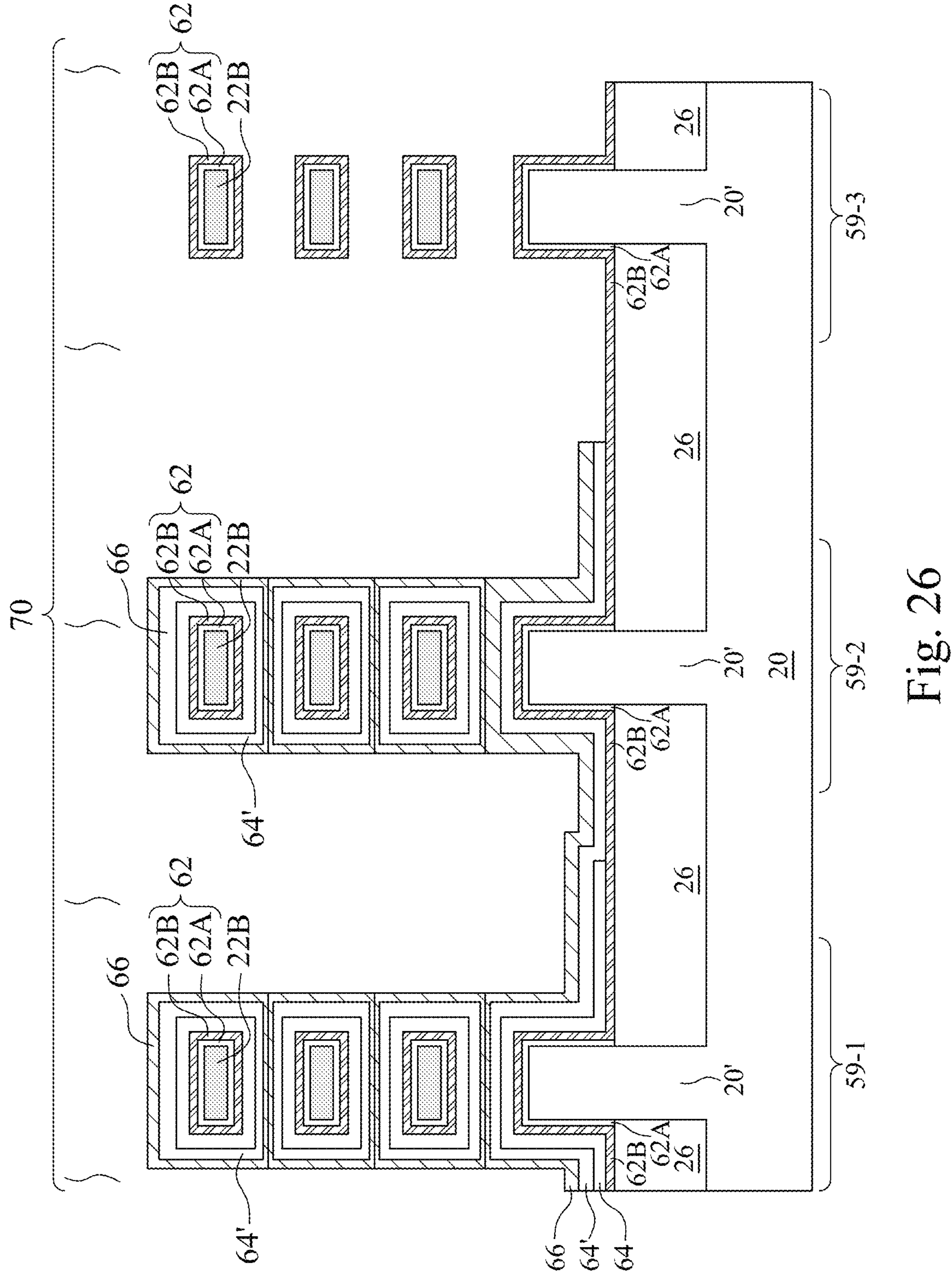

FIG. 26 illustrates the drive-in process 70 to drive the dipole dopant in dipole films 64' and 64 into the portions of high-k dielectric layer 62B in device regions 59-1 and 59-2. The thicker dipole dopant films 64 and 64' in device region 59-1 have a total thickness greater than the thickness of the dipole dopant film 64' in device region 59-2. The concentration (and the atomic percentage) of the dipole dopant driven into the portion of high-k dielectric layer 62B in device region 59-1 is thus higher than that in the portion of high-k dielectric layer 62B in device region 59-2. In device region 59-3, no dipole dopant is doped into the corresponding portion of the high-k dielectric layer 62B.

After the drive-in process 70, the hard mask 66 and dipole films 64' and 64 are removed. The resulting structure is essentially the same as shown in FIG. 21.

FIGS. 27A and 27B through 30A and 30B illustrate the formation of remaining gate stacks and contact plugs in accordance with some embodiments. The respective process is illustrated as process 248 in the process flow 200 shown in FIG. 44. The subsequent figure numbers in FIGS. 27A and 27B through 30A and 30B may have the corresponding numbers followed by letter A or B. The letter A indicates that the corresponding figure shows a cross-section same as the cross-section A2-A2 in FIG. 4, and the letter B indicates that the corresponding figure shows a reference cross-section same as the reference cross-section B-B in FIG. 4. Each of the structures in FIG. 18 or FIG. 26 in device regions 59-1, 59-2, and 59-3 may be followed by the processes in FIGS. 27A and 27B through 30A and 30B to finish the formation of a transistor, with the transistors having tuned or un-tuned threshold voltage.

Figure 27B:
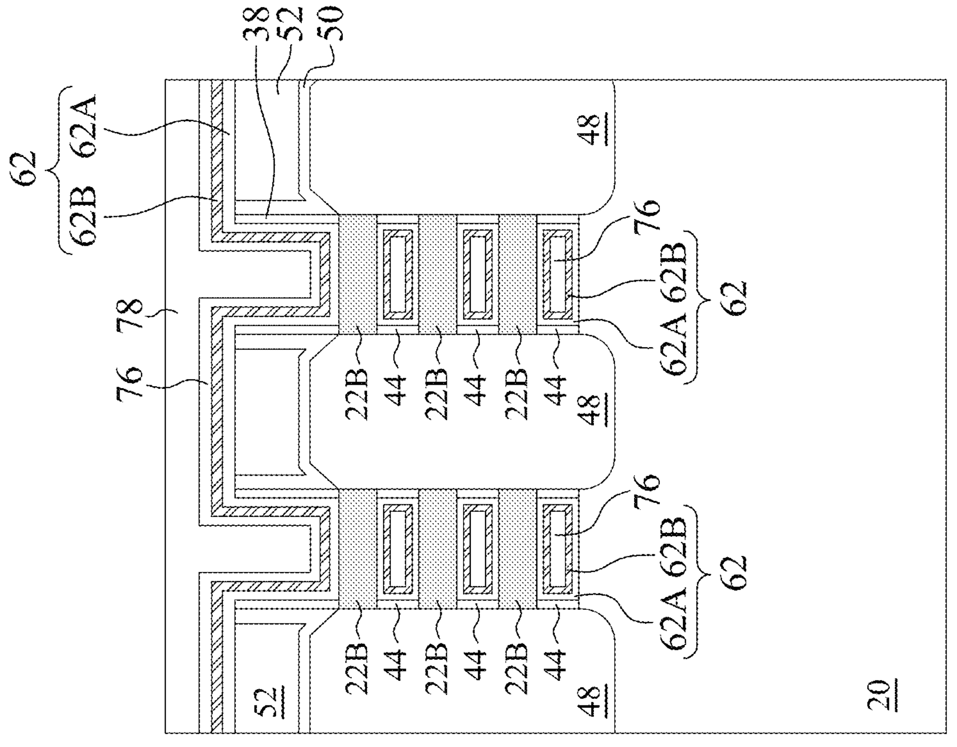
Figure 27A:
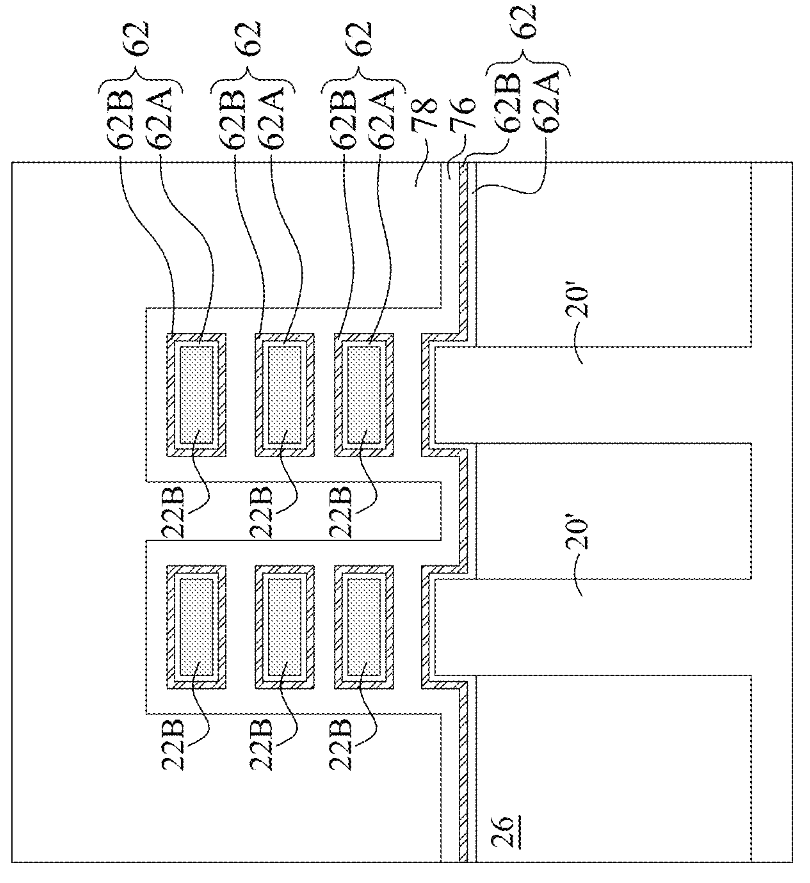

Referring to FIGS. 27A and 27B, stacked conductive layers 76 and filling metal 78 are formed. In accordance with some embodiments, before the stacked conductive layers 76 are formed, an optional high-k dielectric layer may be formed over the high-k dielectric layer 62B. In accordance with some embodiments, conductive layers 76 and filling metal 78 in device regions 59-1, 59-2, and 59-3 are formed in common processes and using common materials, or different materials in different processes. In accordance with alternative embodiments, conductive layers 76 and filling metal 78 are formed through separate processes, and may be formed of a same material or different materials. For example, when the transistors formed in device regions 59-1, 59-2, and 59-3 are of opposite conductivity types, the work-function layers in device regions 59-1, 59-2, and 59-3 are formed of different materials, and are formed in separate processes. In accordance with alternative embodiments, the transistors formed in device region 59-1, 59-2, and 59-3 are of the same conductivity type (both of p-type or both of n-type), but have different performance requirements such as different threshold voltages. Accordingly, the stacked conductive layers 76 in device regions 59-1, 59-2, and 59-3 may also be formed of different processes and/or different materials.

Conductive layers 76 may include a work-function layer, and may or may not include other layers such as capping layers, blocking layers, or the like. For example, when one or both of device regions 59-1, 59-2, and 59-3 is a p-type transistor region, the corresponding work-function layer may include TiN, TaN, TiSiN, WCN, MOCN, or the combinations thereof. When one or both of device regions 59-1, 59-2, and 59-3 is an n-type transistor region, the corresponding work-function layer may include TiAlC, TiAlN, TaAlC, TaAlN, or the like, or combinations thereof. Filling metal 78 may be formed to fill the remaining recesses 58 (FIGS. 13A and 13B) if they are not fully filled yet. Filling metal 78 may include a metal-containing material such as cobalt, ruthenium, aluminum, tungsten, combinations thereof, and/or multilayers thereof.

Figure 28B:
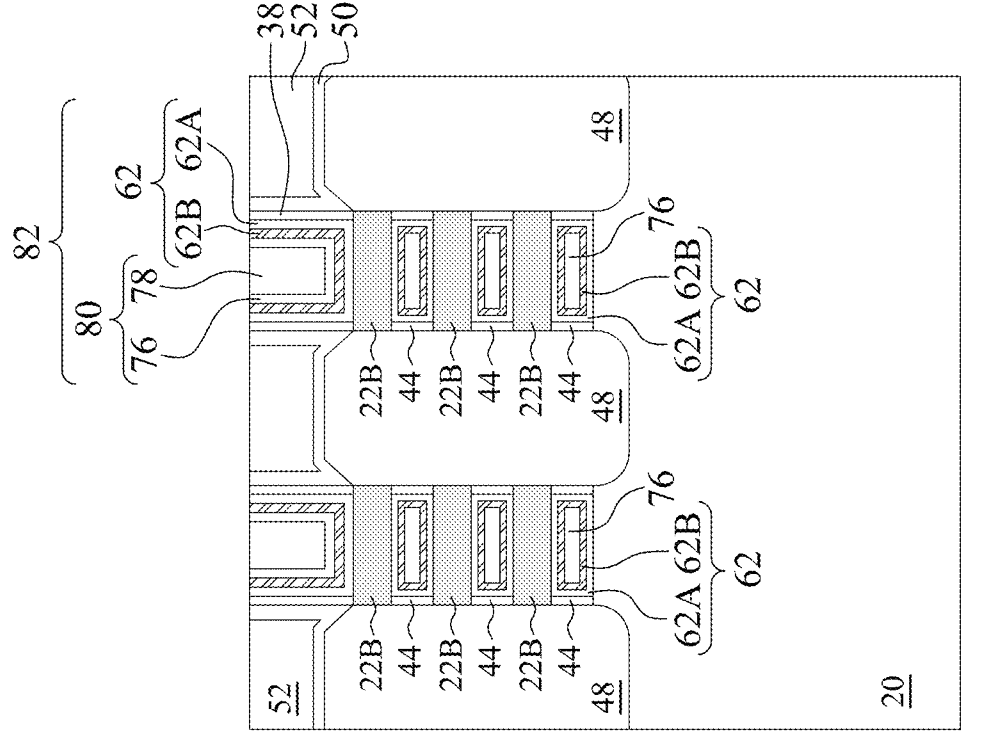
Figure 28A:
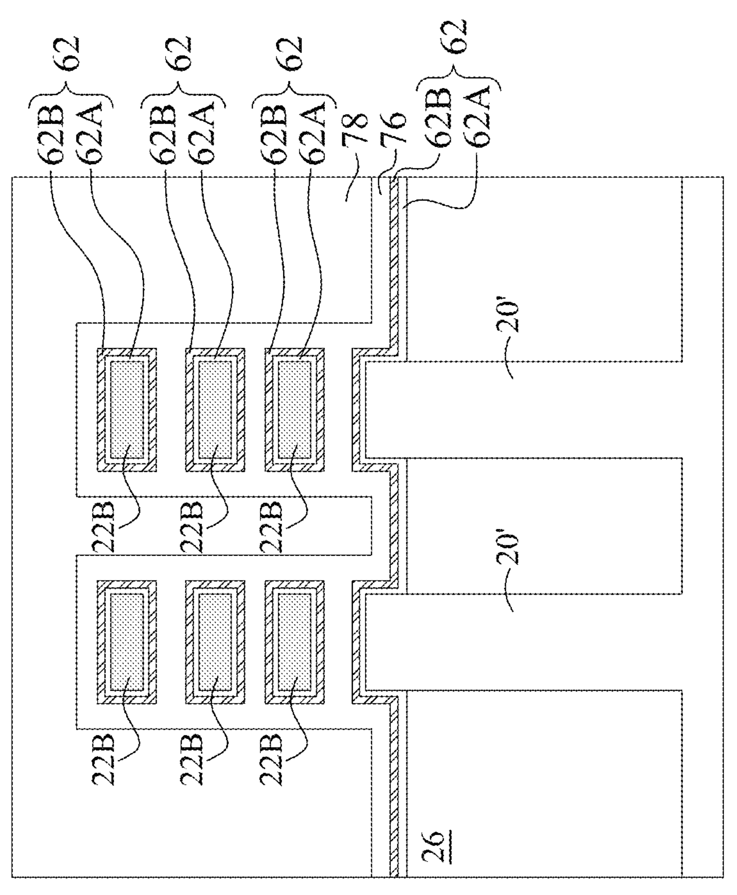

Referring to FIGS. 28A and 28B, after the filling of recesses 58, a planarization process such as a CMP process or a mechanical grinding process is performed to remove the excess portions of the gate dielectrics 62 and the material of gate electrodes 80, which excess portions are over the top surface of ILD 52. The remaining portions of the conductive layers 76 and filling metal 78 form gate electrodes 80. Gate electrodes 80 and gate dielectrics 62 are collectively referred to as gate stacks 82.

Figure 29B:
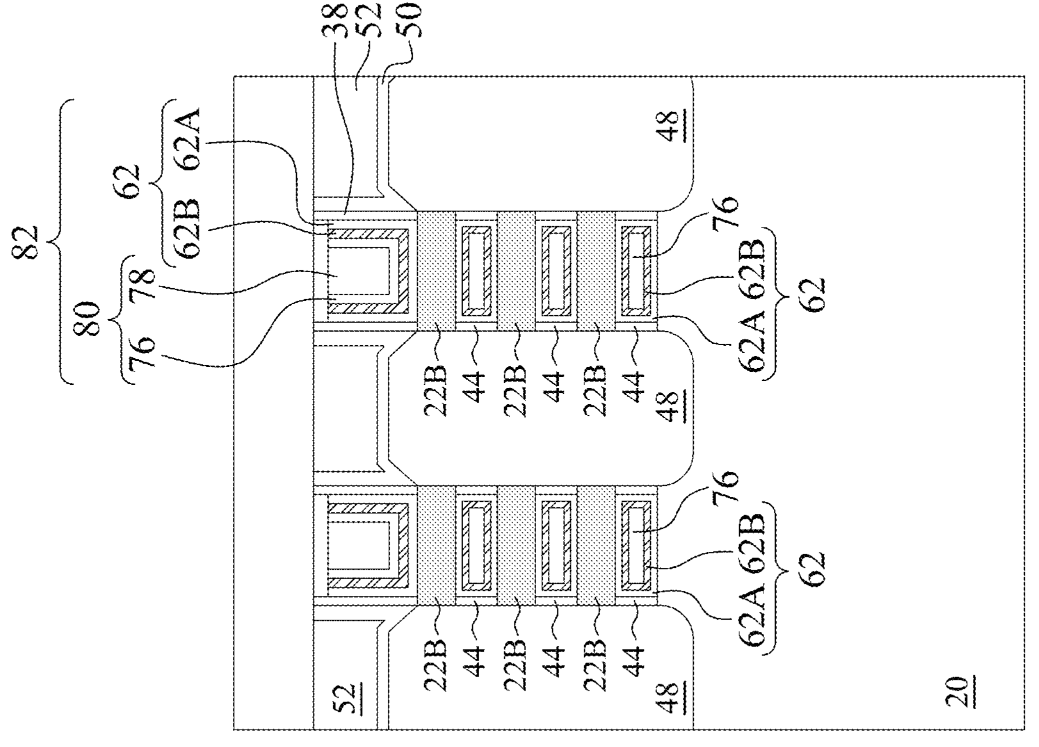
Figure 29A:
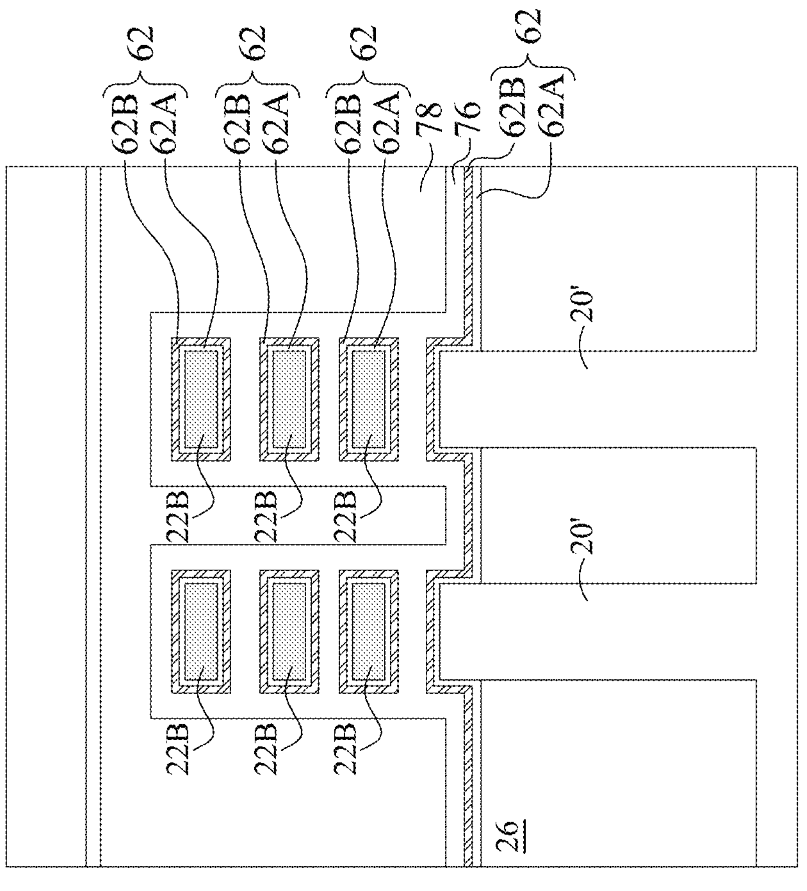

Next, as shown in FIGS. 29A and 29B, gate stacks 82 are recessed, so that recesses are formed directly over gate stacks 82 and between opposing portions of gate spacers 38. A gate mask 84 comprising one or more layers of dielectric material, such as silicon nitride, silicon oxynitride, or the like, is filled in each of the recesses, followed by a planarization process to remove excess portions of the dielectric material extending over ILD 52.

As further illustrated by FIGS. 29A and 29B, ILD 86 is deposited over ILD 52 and over gate masks 84. An etch stop layer (not shown) may be, or may not be, deposited before the formation of ILD 86. In accordance with some embodiments, ILD 86 is formed through FCVD, CVD, PECVD, or the like. ILD 86 is formed of a dielectric material, which may be selected from silicon oxide, PSG, BSG, BPSG, USG, or the like.

Figures 30A, 30B:
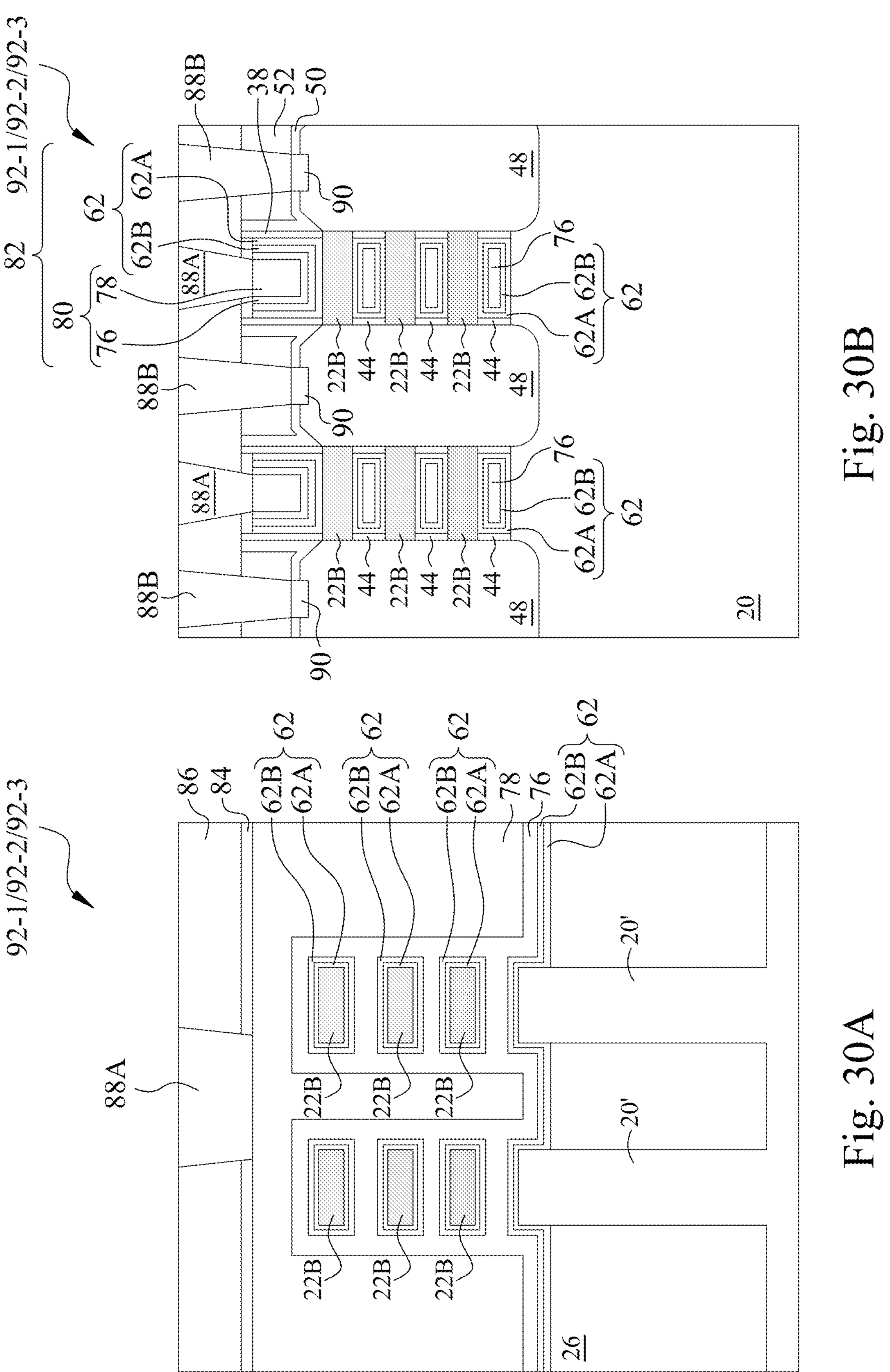

In FIGS. 30A and 30B, ILD 86, ILD 52, CESL 50, and gate masks 84 are etched to form recesses (occupied by contact plugs 88A and 88B) exposing surfaces of the epitaxial source/drain regions 48 and/or gate stacks 82. The recesses may be formed through etching using an anisotropic etching process, such as RIE, NBE, or the like. In accordance with some embodiments, the recesses may be formed by etching-through ILD 86 and ILD 52 using a first etching process, etching-through gate masks 84 using a second etching process, and etching-through CESL 50 possibly using a third etching process.

After the recesses are formed, silicide regions 90 (FIG. 30B) are formed over the epitaxial source/drain regions 48. In accordance with some embodiments, silicide regions 90 are formed by first depositing a metal layer (not shown) capable of reacting with the semiconductor materials of the underlying epitaxial source/drain regions 48 (for example, silicon, silicon germanium, germanium) to form silicide and/or germanide regions, then performing a thermal annealing process to form silicide regions 90. The metal may include nickel, cobalt, titanium, tantalum, platinum, tungsten, or the like. The un-reacted portions of the deposited metal are then removed, for example, by an etching process.

Contact plugs 88B are then formed over silicide regions 90. Also, contact plugs 88A (may also be referred to as gate contact plugs) are also formed in the recesses, and are over and contacting gate electrodes 80. Although FIG. 30B illustrates that contact plugs 88A and 88B are in a same cross-section, in various embodiments, contact plugs 88A and 88B may be formed in different cross-sections, thereby reducing the risk of shorting with each other. GAA transistors 92-1, 92-2, and 92-3, which are represented by GAA transistor 92, are thus formed in device regions 59-1, 59-2, and 59-3 (FIG. 21 or FIG. 26), respectively.

Figure 41:
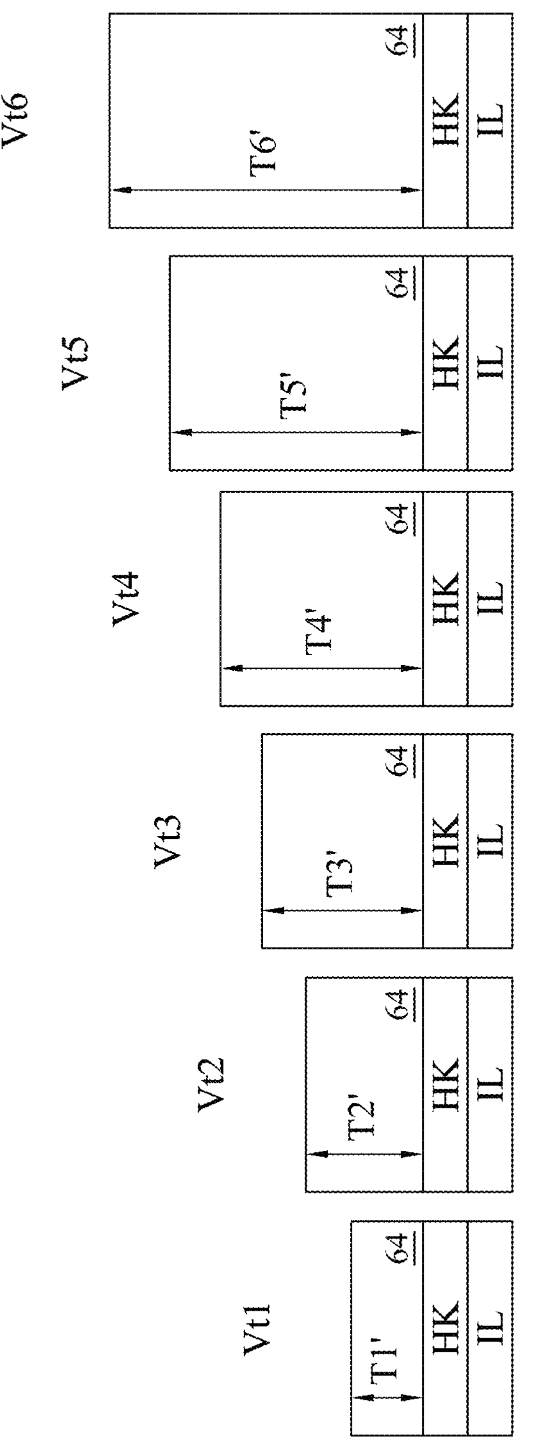
FIG. 41 schematically illustrates tuning the threshold voltages of multiple transistors through dipole dopant films (alternatively referred to as dipole films) having different thicknesses in accordance with some embodiments.

In above-discussed embodiments as shown in FIGS. 14 through 26, three device regions are illustrated, with the device regions having different dipole dopant concentrations (and different atomic percentages) through controlling the numbers of dopant incorporation processes, and the thicknesses of the dipole dopant films. This concept may be generalized to result in a greater number of threshold voltage tuning. For example, FIG. 41 illustrates a concept of tuning multiple transistors to have different threshold voltages Vt1, Vt2, Vt3, Vt4, Vt5, and Vt6. This can be achieved by controlling the total number of dipole dopant films 64 to thicknesses T1', T2', T3', T4', T5', and T6', respectively. It is appreciated that when multiple dipole dopant films are adopted for a transistor, the drive-in of the dipole dopant may be achieved in different drive-in processes, or in a same drive-in process. For example, thickness T2' may be achieved by two dipole dopant films. The drive-in of the dipole dopant with thickness T2' may be achieved by depositing two dipole dopant films, each accompanies by a drive-in process, or by in a same drive-in process.

Figure 42:
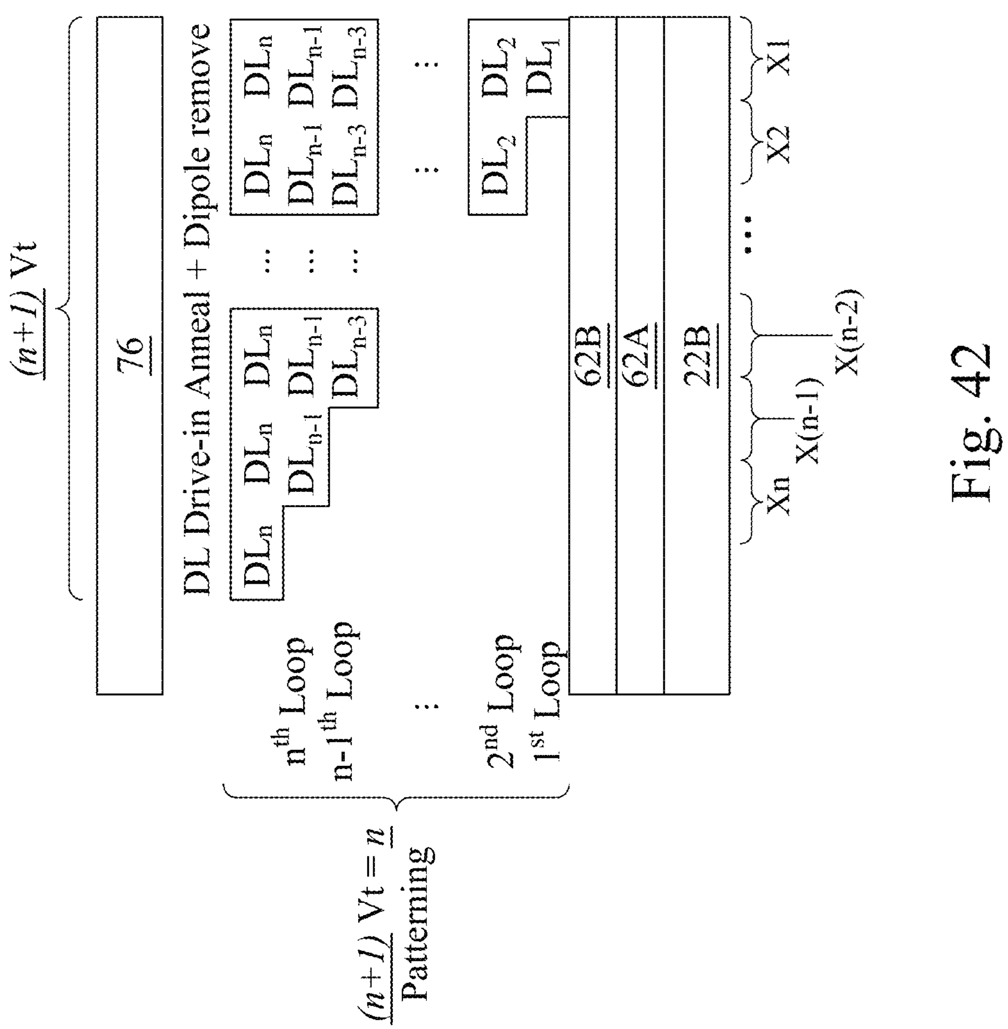
FIGS. 42-43 schematically illustrate two processes for forming multi-Vt devices (transistors) in accordance with some embodiments.

FIG. 42 illustrates an embodiment in which there are a plurality of transistors X1 through Xn, with integer n being any number greater than 1. Through deposition and patterning processes, the dipole dopant doping corresponding to the transistors may be achieved by depositing and patterning a plurality of dipole dopant films DL1 through DLn in a plurality of loops. For example, in the first loop, dipole dopant films DL1 is deposited, and is removed from transistors X2 through Xn. In the second loop, dipole dopant films DL2 is deposited, and is removed from transistors X3 through Xn. Such process goes on, with each of the loop having its corresponding dipole dopant film removed from one fewer transistor regions than the previous loop. This eventually will results n+1 levels (including the level with no dipole film) of total thicknesses of the dipole dopant films. After the drive-in process, there will be n+1 dipole dopant concentration levels (including a transistor that has no dipole dopant incorporated) and n+1 Vt tuning levels.

Figure 43:
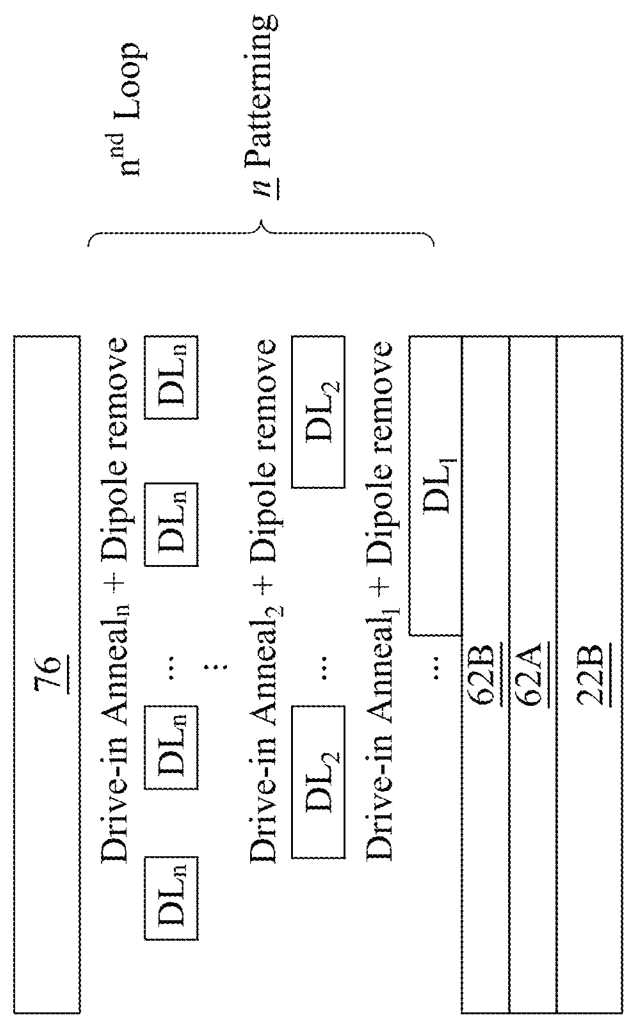

FIG. 43 illustrates an embodiment, in which a plurality of loops are performed. Each corresponding dipole dopant film experiences a deposition process, a patterning process, a drive-in process, and a removal process. Each of the loops may have portions left in different combinations of transistors than other loops. Accordingly, there will be a plurality of levels of Vt tuning, such as $2^n$ Vt tuning levels.

The embodiments of the present disclosure have some advantageous features. By adopting AlN layers as dipole dopant films to provide dipole dopants, a higher degree of dipole doping may be achieved, and the efficiency in the Vt tuning through dipole dopant doping is improved. The Vt tuning is volume-less since the dipole dopant films are removed. The formation of AlO may help to catch nitrogen from diffusing into high-k dielectric layers, and hence the adverse effect of nitrogen is reduced.

In accordance with some embodiments of the present disclosure, a method includes forming a first gate dielectric on a first semiconductor region; depositing a first aluminum nitride layer on the first gate dielectric; depositing an aluminum oxide layer on the first aluminum nitride layer; performing a first annealing process to drive aluminum in the first aluminum nitride layer into the first gate dielectric; removing the aluminum oxide layer and the first aluminum nitride layer; and forming a gate electrode on the first gate dielectric. In an embodiment, the first aluminum nitride layer and the aluminum oxide layer are ex-situ deposited, with a vacuum break in between.

In an embodiment, the first aluminum nitride layer and the aluminum oxide layer are in-situ deposited in a same vacuum environment. In an embodiment, the first aluminum nitride layer is deposited through a chemical vapor deposition process. In an embodiment, the chemical vapor deposition process comprises a multi-pulse chemical vapor deposition process. In an embodiment, the multi-pulse chemical vapor deposition process comprises pulsing a nitrogen-containing precursor; and when the nitrogen-containing precursor is being pulsed, performing a plurality of pulsing processes to conduct an aluminum-containing precursor. In an embodiment, the first annealing process is performed when the aluminum oxide layer is on the first aluminum nitride layer.

In an embodiment, the method further comprises forming a patterned etching mask over the aluminum oxide layer; patterning the aluminum oxide layer using the patterned etching mask to define patterns; and patterning the first aluminum nitride layer using the aluminum oxide layer as an etching mask. In an embodiment, the method further comprises forming a second gate dielectric on a second semiconductor region, wherein the second semiconductor region overlaps, and is spaced apart from, the first semiconductor region, and wherein the first aluminum nitride layer and the aluminum oxide layer are also formed on the second semiconductor region. In an embodiment, the aluminum oxide layer comprises a portion filled into a space between the first semiconductor region and the second semiconductor region.

In an embodiment, an entirety of the aluminum oxide layer is out of a space between the first semiconductor region and the second semiconductor region. In an embodiment, the method further comprises, before the first annealing process, depositing a second aluminum nitride layer on the first aluminum nitride layer, wherein the aluminum oxide layer is deposited on the second aluminum nitride layer. In an embodiment, the method further comprises depositing a second aluminum nitride layer, wherein the first annealing process is performed before the second aluminum nitride layer is deposited.

In accordance with some embodiments of the present disclosure, a method comprises forming a first gate dielectric on a first semiconductor region and a second gate dielectric on a second semiconductor region; depositing a first aluminum nitride layer on the first gate dielectric; depositing a second aluminum nitride layer on the first gate dielectric; driving aluminum in the first aluminum nitride layer and the second aluminum nitride layer into the first gate dielectric; depositing the second aluminum nitride layer on the second gate dielectric; driving aluminum in the second aluminum nitride layer into the second gate dielectric; and forming a first gate electrode on the first gate dielectric and a second gate electrode on the second gate dielectric.

In an embodiment, when aluminum in the first aluminum nitride layer and the second aluminum nitride layer are driven into the first gate dielectric, the second aluminum nitride layer is over the first aluminum nitride layer. In an embodiment, the method further comprises, before the second aluminum nitride layer is deposited, removing the first aluminum nitride layer, wherein the aluminum in the first aluminum nitride layer and the second aluminum nitride layer are driven into the first gate dielectric in separate drive-in processes. In an embodiment, the method further comprises depositing an aluminum oxide layer over the first aluminum nitride layer, wherein when aluminum in the first aluminum nitride layer is driven into the first semiconductor region, the aluminum oxide layer is over the first aluminum nitride layer.

In accordance with some embodiments of the present disclosure, a method comprises forming a first nanostructure and a second nanostructure overlapping the first nanostructure, wherein the first nanostructure is spaced apart from the second nanostructure by a space; forming a first gate dielectric and a second gate dielectric on the first nanostructure and the second nanostructure, respectively; depositing an aluminum nitride layer comprising a first portion on the first gate dielectric and a second portion on the second gate dielectric; depositing an aluminum oxide layer on the aluminum nitride layer; driving aluminum in the aluminum nitride layer into the first gate dielectric and the second gate dielectric; and removing the aluminum oxide layer and the aluminum nitride layer. In an embodiment, the first portion of the aluminum nitride layer is joined with the second portion of the aluminum nitride layer. In an embodiment, the first portion of the aluminum nitride layer is separated apart from the second portion of the aluminum nitride layer by the aluminum oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first gate dielectric on a first semiconductor region;

depositing a first aluminum nitride layer on the first gate dielectric;

after the first aluminum nitride layer is deposited, depositing an aluminum oxide layer on the first aluminum nitride layer;

performing a first annealing process to drive aluminum in the first aluminum nitride layer into the first gate dielectric;

removing the aluminum oxide layer and the first aluminum nitride layer;

after the aluminum oxide layer and the first aluminum nitride layer are removed, depositing a second aluminum nitride layer over the first gate dielectric;

removing the second aluminum nitride layer; and forming a gate electrode on the first gate dielectric.

2. The method of claim 1, wherein the first aluminum nitride layer and the aluminum oxide layer are ex-situ deposited, with a vacuum break in between.

3. The method of claim 1, wherein the first aluminum nitride layer and the aluminum oxide layer are in-situ deposited in a same vacuum environment.

4. The method of claim 1, wherein the first aluminum nitride layer is deposited through a chemical vapor deposition process.

5. The method of claim 4, wherein the chemical vapor deposition process comprises a multi-pulse chemical vapor deposition process.

6. The method of claim 5, wherein the multi-pulse chemical vapor deposition process comprises:

pulsing a nitrogen-containing precursor; and when the nitrogen-containing precursor is being pulsed, performing a plurality of pulsing processes to conduct an aluminum-containing precursor.

7. The method of claim 1, wherein the first annealing process is performed when the aluminum oxide layer is on the first aluminum nitride layer.

8. The method of claim 1 further comprising:

forming a patterned etching mask over the aluminum oxide layer;

patterning the aluminum oxide layer using the patterned etching mask to define patterns; and patterning the first aluminum nitride layer using the aluminum oxide layer as an etching mask.

9. The method of claim 1 further comprising forming a second gate dielectric on a second semiconductor region, wherein the second semiconductor region overlaps, and is spaced apart from, the first semiconductor region, and wherein the first aluminum nitride layer and the aluminum oxide layer are also formed on the second semiconductor region.

10. The method of claim 9, wherein the aluminum oxide layer comprises a portion filled into a space between the first semiconductor region and the second semiconductor region.

11. The method of claim 9, wherein an entirety of the aluminum oxide layer is out of a space between the first semiconductor region and the second semiconductor region.

12. The method of claim 1, wherein both of the first aluminum nitride layer and the second aluminum nitride layer, when formed, are formed as being in contact with the first gate dielectric.

13. The method of claim 1 further comprising:
forming an additional aluminum oxide layer over the second aluminum nitride layer; and
forming a second annealing process at a time the additional aluminum oxide layer is over the second aluminum nitride layer.

14. The method of claim 1, wherein the first aluminum nitride layer and the aluminum oxide layer have a distinguishable interface in between.

15. A method comprising:
forming a first gate dielectric on a first semiconductor region and a second gate dielectric on a second semiconductor region;
depositing a first aluminum nitride layer on the first gate dielectric;
depositing a first aluminum oxide layer over the first aluminum nitride layer;
performing a first drive-in process to drive aluminum in the first aluminum nitride layer into the first gate dielectric;
removing the first aluminum oxide layer and the first aluminum nitride layer;
after the first aluminum nitride layer is removed, depositing a second aluminum nitride layer on the first gate dielectric;
performing a second drive-in process to drive aluminum in the second aluminum nitride layer into the first gate dielectric; and
forming a first gate electrode on the first gate dielectric and a second gate electrode on the second gate dielectric.

16. The method of claim 15, wherein when aluminum in the first aluminum nitride layer is driven into the first semiconductor region by the first drive-in process, the first aluminum oxide layer is over the first aluminum nitride layer.

17. The method of claim 15, wherein during the first drive-in process, the first aluminum oxide layer is an outmost layer of a respective wafer.

18. A method comprising:
forming a first nanostructure and a second nanostructure overlapping the first nanostructure, wherein the first nanostructure is spaced apart from the second nanostructure by a space;
forming a first gate dielectric and a second gate dielectric on the first nanostructure and the second nanostructure, respectively;
depositing a first aluminum nitride layer comprising a first portion on the first gate dielectric and a second portion on the second gate dielectric;
after the first aluminum nitride layer is deposited, depositing a first aluminum oxide layer on the first aluminum nitride layer;
driving aluminum in the first aluminum nitride layer into the first gate dielectric and the second gate dielectric, wherein during the driving, the first aluminum oxide layer is over the first aluminum nitride layer;
removing the first aluminum oxide layer and the first aluminum nitride layer;
after the first aluminum oxide layer and the first aluminum nitride layer are removed, depositing a second aluminum nitride layer over the first gate dielectric; and
depositing a second aluminum oxide layer over the second aluminum nitride layer.

19. The method of claim 18 further comprising:
performing an anneal process at a time when the second aluminum oxide layer and the second aluminum nitride layer are over the first gate dielectric; and
removing the second aluminum oxide layer and the second aluminum nitride layer.

20. The method of claim 18, wherein the first aluminum oxide layer and the first aluminum nitride layer encircle the first gate dielectric and the second gate dielectric.

* * * * *